United States Patent
Wada et al.

(10) Patent No.: US 11,581,589 B2
(45) Date of Patent: Feb. 14, 2023

(54) MANAGEMENT DEVICE, ENERGY STORAGE APPARATUS, CAUSE ANALYSIS METHOD, ENGINE-DRIVEN VEHICLE, AND ELECTRIC VEHICLE

(71) Applicant: GS Yuasa International Ltd., Kyoto (JP)

(72) Inventors: Naoya Wada, Kyoto (JP); Eiji Hayashi, Kyoto (JP); Masashi Nakamura, Rittoshi (JP); Yuki Matsuda, Rittoshi (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 349 days.

(21) Appl. No.: 16/758,356

(22) PCT Filed: Nov. 2, 2018

(86) PCT No.: PCT/JP2018/040888
§ 371 (c)(1),
(2) Date: Apr. 22, 2020

(87) PCT Pub. No.: WO2019/088264
PCT Pub. Date: May 9, 2019

(65) Prior Publication Data
US 2020/0343598 A1    Oct. 29, 2020

(30) Foreign Application Priority Data
Nov. 2, 2017 (JP) .............................. JP2017-212664

(51) Int. Cl.
*H02J 7/00* (2006.01)
*H01M 10/48* (2006.01)
*H01M 10/42* (2006.01)

(52) U.S. Cl.
CPC ....... *H01M 10/48* (2013.01); *H01M 10/4285* (2013.01)

(58) Field of Classification Search
USPC ....... 320/107, 108, 109, 130, 131, 132, 133, 320/134
See application file for complete search history.

(56) References Cited

U.S. PATENT DOCUMENTS

| 2010/0194398 A1 | 8/2010 | Kawasumi et al. |
| 2012/0100405 A1 | 4/2012 | Noda et al. |
| 2018/0178656 A1* | 6/2018 | Takegawa ................ H02P 6/24 |

FOREIGN PATENT DOCUMENTS

| JP | 2000-028690 A | 1/2000 |
| JP | 2009-096417 A | 5/2009 |

(Continued)

OTHER PUBLICATIONS

International Searching Authority, International Search Report and Written Opinion for International Application No. PCT/JP2018/040888, dated Jan. 15, 2019, (9 pages), Japanese Patent Office, Tokyo, Japan.

*Primary Examiner* — Brian Ngo
(74) *Attorney, Agent, or Firm* — Alston & Bird LLP

(57) ABSTRACT

A management device 50 for power storage elements is provided with a cause analysis unit 51 that, when the voltages of power storage elements B1-B4 are reduced to a prescribed level or physical quantities correlated with the voltages are reduced to prescribed values after the supply of power to the power storage elements B1-B4 has been stopped, analyzes the cause of the voltage reduction in power storage elements B1-B4 or the cause of the reduction in the physical quantities correlated with voltages to the prescribed values, on the basis of measurement data of the power storage elements B1-B4 measured after the supply of power has been stopped.

17 Claims, 15 Drawing Sheets

(56) References Cited

FOREIGN PATENT DOCUMENTS

| JP | 2010-181262 A | 8/2010 | | |
| JP | 2010181262 A | * 8/2010 | ............ | H01M 10/42 |
| JP | 2011-142036 A | 7/2011 | | |
| JP | 2012-095433 A | 5/2012 | | |
| JP | 5034859 B2 | 9/2012 | | |
| JP | 2013-074708 A | 4/2013 | | |
| JP | 2013-219984 A | 10/2013 | | |
| JP | 2013-242324 A | 12/2013 | | |
| JP | 2015-072148 A | 4/2015 | | |

* cited by examiner

MANAGEMENT DEVICE, ENERGY STORAGE APPARATUS, CAUSE ANALYSIS METHOD, ENGINE-DRIVEN VEHICLE, AND ELECTRIC VEHICLE

CROSS REFERENCE TO RELATED APPLICATIONS

This application is a national stage application, filed under 35 U.S.C. § 371, of International Application No. PCT/JP2018/040888, filed Nov. 2, 2018, which claims priority to Japan Application No. 2017-212664, filed Nov. 2, 2017; the contents of both of which as are hereby incorporated by reference in their entireties.

BACKGROUND

Technical Field

The present invention relates to a technique for analyzing a cause for a fall in a voltage of an energy storage device or a cause for a fall in a physical quantity correlated with the voltage.

Description of Related Art

When an energy storage device such as a lithium ion secondary battery detects a low voltage fault of a battery, the energy storage device blocks a current flowing from the battery by using a protective device, e.g., a relay, so as to prevent the battery from being put in an overdischarge state. However, when the battery is not charged with electricity for a long period of time after an operation of the protective device, the battery may self discharge or discharge the current (dark current) to a management device and may eventually be in the overdischarge state. Patent Reference No. JP-B2-5034859 discloses a determination on the overdischarge based on a minimum voltage of the battery during an engine stop. Patent Document 1 also discloses a determination on a cause for the overdischarge based on a running frequency or an average voltage of the battery during the running.

BRIEF SUMMARY

In Patent Reference No. JP-B2-5034859, the cause for the overdischarge is determined based on the running frequency or the average voltage of the battery during the running. In Patent Reference No. JP-B2-5034859, however, the cause for the overdischarge is determined only when data of the battery during a vehicle running is obtained. Accordingly, when the data of the battery during the vehicle running is not obtained in a case of a long-term neglect of the vehicle or the like, it is difficult to analyze the cause for the overdischarge.

The present invention has been made in view of the respects above, and an object of the present invention is, even when the data of the energy storage device during the vehicle running is not obtained in the case of the long-term neglect of the vehicle or the like, to analyze a cause for a fall in a voltage of the energy storage device to a predetermined voltage or a cause for a fall in a physical quantity correlated with the voltage to a predetermined value.

The present invention provides a management device for an energy storage device. The management device includes a cause analysis unit. The cause analysis unit is configured, when a voltage of the energy storage device falls to a predetermined voltage after a stop of a power supply to the energy storage device or when a physical quantity correlated with the voltage falls to a predetermined value after the stop of the power supply to the energy storage device, to analyze a cause for a fall in the voltage of energy storage device to the predetermined voltage or a cause for a fall in the physical quantity correlated with the voltage to the predetermined value, based on measured data of the energy storage device, the measured data measured after the stop of the power supply.

These techniques may be applicable to a cause analysis method of analyzing the cause for the fall in the voltage of the energy storage device or the cause for the fall in the physical quantity correlated with the voltage. These techniques may be applicable to an energy storage apparatus including the energy storage device, a measurement unit, a current breaker device, and a management device, and may be applicable to a vehicle on which the energy storage apparatus is mounted. These techniques may be provided in various aspects, such as a program for analyzing the cause for the fall in the voltage of the energy storage device or the cause for the fall in the physical quantity correlated with the voltage, and a storage medium or the like for storing the program.

In this configuration, even without data obtained regarding an energy storage device during a vehicle running, it is possible to analyze a cause for a fall in a voltage of the energy storage device to a predetermined voltage or a cause for a fall in a physical quantity correlated with the voltage to a predetermined value.

DETAILED DESCRIPTION OF VARIOUS EMBODIMENTS

Figure 1:
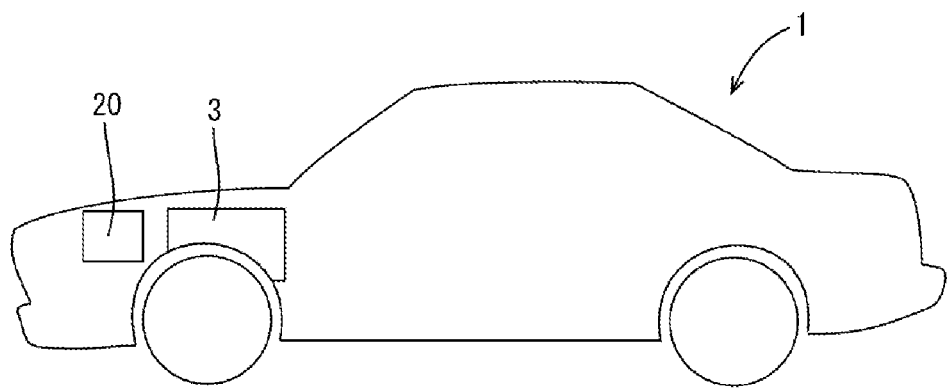
FIG. 1 is a side view of a vehicle.

The present invention provides a management device for an energy storage device. The management device includes a cause analysis unit. The cause analysis unit is configured, when a voltage of the energy storage device falls to a predetermined voltage after a stop of a power supply to the energy storage device or when a physical quantity correlated with the voltage falls to a predetermined value after the stop of the power supply to the energy storage device, to analyze a cause for a fall in the voltage of energy storage device to the predetermined voltage or a cause for a fall in the physical quantity correlated with the voltage to the predetermined value, based on measured data of the energy storage device, the measured data measured after the stop of the power supply. The measured data of the energy storage device provides a measured value of a state of the energy storage device such as the voltage or a current. The measured value of the state may include a temperature of the energy storage device. The measured data of the energy storage device may include a measured value of an environment surrounding the energy storage device, such as an environmental temperature of the energy storage device, in addition to the measured value of the state.

In this configuration, by analyzing the measured data during a period that the power supply to the energy storage device stops and thus the energy storage device is not charged with electricity, it is possible to analyze the cause for the fall in the voltage of the energy storage device to the predetermined voltage or the cause for the fall in the physical quantity correlated with the voltage to the predetermined value. In this configuration, even without data obtained regarding the energy storage device during a vehicle running, it is possible to analyze the cause for the discharge of the voltage of the energy storage device to the predetermined voltage or the cause for the fall in the physical quantity correlated with the voltage to the predetermined value.

The cause analysis unit may determine whether or not the cause for the fall in the voltage of the energy storage device to the predetermined voltage or the cause for the fall in the physical quantity correlated with the voltage to the predetermined value is a usage method of the energy storage device. The usage method (a usage mode) of the energy storage device includes a usage environment such as the environmental temperature of the energy storage device, a period of time that the energy storage device is left, and a loaded state of the energy storage device such as a magnitude of a load.

In this configuration, when the usage method of the energy storage device is the cause, a supplier of the energy storage apparatus may take a countermeasure such as providing a request for an improvement in the usage method.

The cause analysis unit may determine that the cause for the fall in the voltage of the energy storage device to the predetermined voltage or the cause for the fall in the physical quantity correlated with the voltage to the predetermined value is the usage method of the energy storage device in any one of the following cases: when the current from the energy storage device measured after the stop of the power supply is greater than a current threshold; when the environmental temperature of the energy storage device measured after the stop of the power supply is greater than a temperature threshold; and when time elapsed from the stop of the power supply until the fall in the voltage of the energy storage device to the predetermined voltage or time elapsed from the stop of the power supply until the fall in the physical quantity correlated with the voltage to the predetermined value is greater than reference time.

In this configuration, when the voltage of the energy storage device falls to the predetermined voltage due to an overload of the energy storage device, the usage of the energy storage device in a high-temperature environment, neglect of the energy storage device for an excessive period of time, or the like, the cause analysis unit may determine that the cause is the usage method of the energy storage device. The same applies to when the physical quantity correlated with the voltage falls to the predetermined value.

The management device may include a storage unit configured to store the measured data of the energy storage device after the stop of the power supply to the energy storage device.

In this configuration, the cause analysis unit may post-analyze the measured data stored in the storage unit to identify the cause for the fall in the voltage of the energy storage device to the predetermined voltage. The same applies to when the physical quantity correlated with the voltage falls to the predetermined value.

The measured data of the energy storage device measured after the stop of the power supply may include two or more values among the voltage of the energy storage device, the current from the energy storage device, the environmental temperature of the energy storage device, and the time elapsed after the stop of the power supply, the two or more values including the voltage of the energy storage device.

In this configuration, when the voltage of the energy storage device falls to the predetermined voltage, it is possible to identify a cause that is correlated with at least any one of the following: the current from the energy storage device, the environmental temperature of the energy storage device, and the time elapsed after the stop of the power supply. The same applies to when the physical quantity correlated with the voltage falls to the predetermined value.

The cause analysis unit may determine, based on the current flowing from the energy storage device to the load during a period from the stop of the power supply until the fall in the voltage of the energy storage device to the predetermined voltage or during a period from the stop of the power supply until the fall in the physical quantity correlated with the voltage to the predetermined value, whether or not the cause for the fall in the voltage of the energy storage device to the predetermined voltage or the cause for the fall in the physical quantity correlated with the voltage to the predetermined value is the overload.

In this configuration, it is possible to determine whether or not the cause for the fall in the voltage of the energy storage device to the predetermined voltage or the cause for the fall in the physical quantity correlated with the voltage to the predetermined value is the overload. Accordingly, when the cause is the overload, the supplier of the energy storage apparatus may provide a warning or the like to reduce the load, so that a low voltage fault due to the fall in the voltage after a replacement of the energy storage device is less prone to reoccur.

The cause analysis unit may be configured: to calculate, based on data of the voltage of the energy storage device, a first discharge capacity that the energy storage device discharges during the period from the stop of the power supply until the fall in the voltage of the energy storage device to the predetermined voltage or during the period from the stop of the power supply until the fall in the physical quantity correlated with the voltage to the predetermined value; to calculate, based on data of the current from the energy storage device, a second discharge capacity that the energy storage device discharges to the load during the period from the stop of the power supply until the fall in the voltage of the energy storage device to the predetermined voltage or during the period from the stop of the power supply until the fall in the physical quantity correlated with the voltage to the predetermined value; and to determine, based on a difference between the first discharge capacity calculated and the second discharge capacity calculated, whether or not the cause for the fall in the voltage of the energy storage device to the predetermined voltage or the cause for the fall in the physical quantity correlated with the voltage to the predetermined value is an internal short-circuit of the energy storage device.

When the energy storage device has an internal short-circuit, the first discharge capacity is larger than when the energy storage device does not have the internal short-circuit, and thus the difference between the first discharge capacity and the second discharge capacity is increased. Accordingly, based on a magnitude of the difference between the first discharge capacity and the second discharge capacity, it is possible to determine whether or not the cause for the fall in the voltage of the energy storage device to the predetermined voltage or the cause for the fall in the physical quantity correlated with the voltage to the predetermined value is the internal short-circuit of the energy storage device. When the cause is the internal short-circuit, the supplier of the energy storage apparatus may request a user to take a countermeasure in accordance with the cause by providing a warning or the like to replace the energy storage device.

The energy storage device is provided in a plurality, and the plurality of energy storage devices are connected to each other in series. The cause analysis unit may determine, based on a difference in the voltages between the energy storage devices at a time point of falls in the voltages of the energy storage devices to predetermined voltages or at a time point of falls in physical quantities correlated with the voltages to the predetermined values, whether or not the cause for the falls in the voltages of the energy storage devices to the predetermined voltages or the cause for the falls in the physical quantities correlated with the voltages to the predetermined values is the internal short-circuit of the energy storage devices.

In this configuration, the cause analysis unit uses the difference in the voltages and thus results in a small measurement error. Here, it is possible to accurately determine whether or not the cause for the falls in the voltages of the energy storage devices to the predetermined voltages or the cause for the falls in the physical quantities correlated with the voltages to the predetermined values is the internal short-circuit of the energy storage devices.

The management device includes a time measurement unit for measuring time duration, and the cause analysis unit may determine, based on the period from the stop of the power supply until the fall in the voltage of the energy storage device to the predetermined voltage or the period from the stop of the power supply until the fall in the physical quantity correlated with the voltage to the predetermined value, whether or not the cause for the fall in the voltage of the energy storage device to the predetermined voltage or the cause for the fall in the physical quantity correlated with the voltage to the predetermined value is a long-term neglect.

In this configuration, it is possible to determine whether or not the cause for the fall in the voltage of the energy storage device to the predetermined voltage or the cause for the fall in the physical quantity correlated with the voltage to the predetermined value is the long-term neglect. Accordingly, when the cause is the long-term neglect, the supplier of the energy storage apparatus may provide a warning or the like to the user to leave the vehicle for a shorter period, so that the low voltage fault due to the fall in the voltage after the replacement of the energy storage device is less prone to reoccur.

The predetermined voltage may be set at a voltage where a current breaker device blocks the current. In this configuration, it is possible to analyze a cause for the blockage of the current by the current breaker device.

First Embodiment

1. Description of Battery

Figure 2:
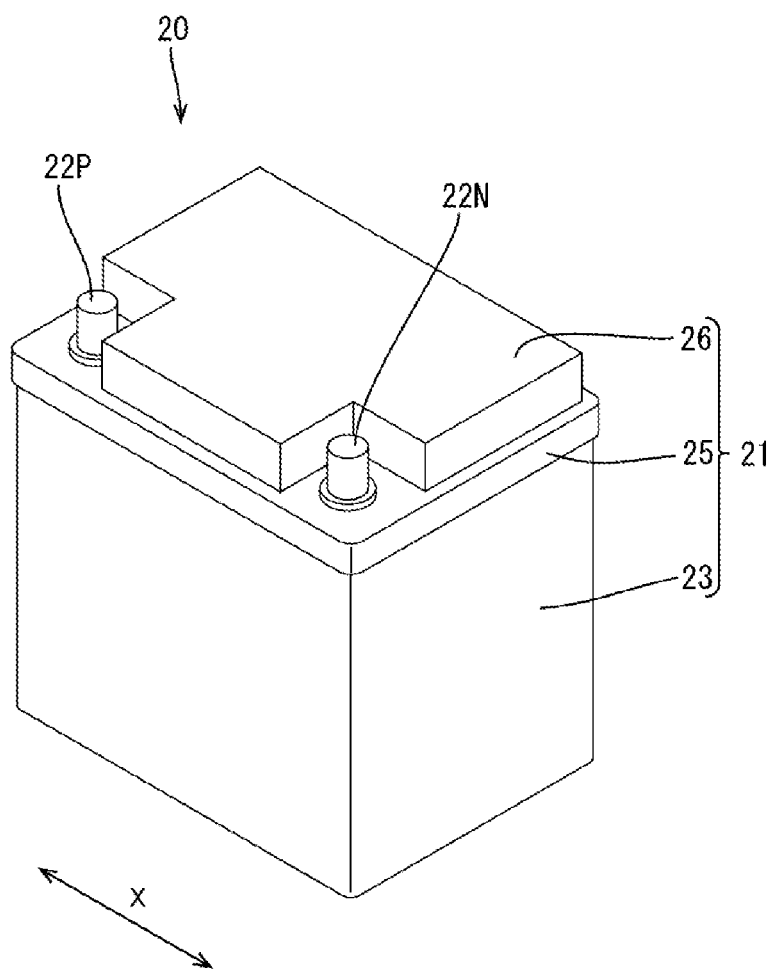
FIG. 2 is a perspective view of a battery.
Figure 3:
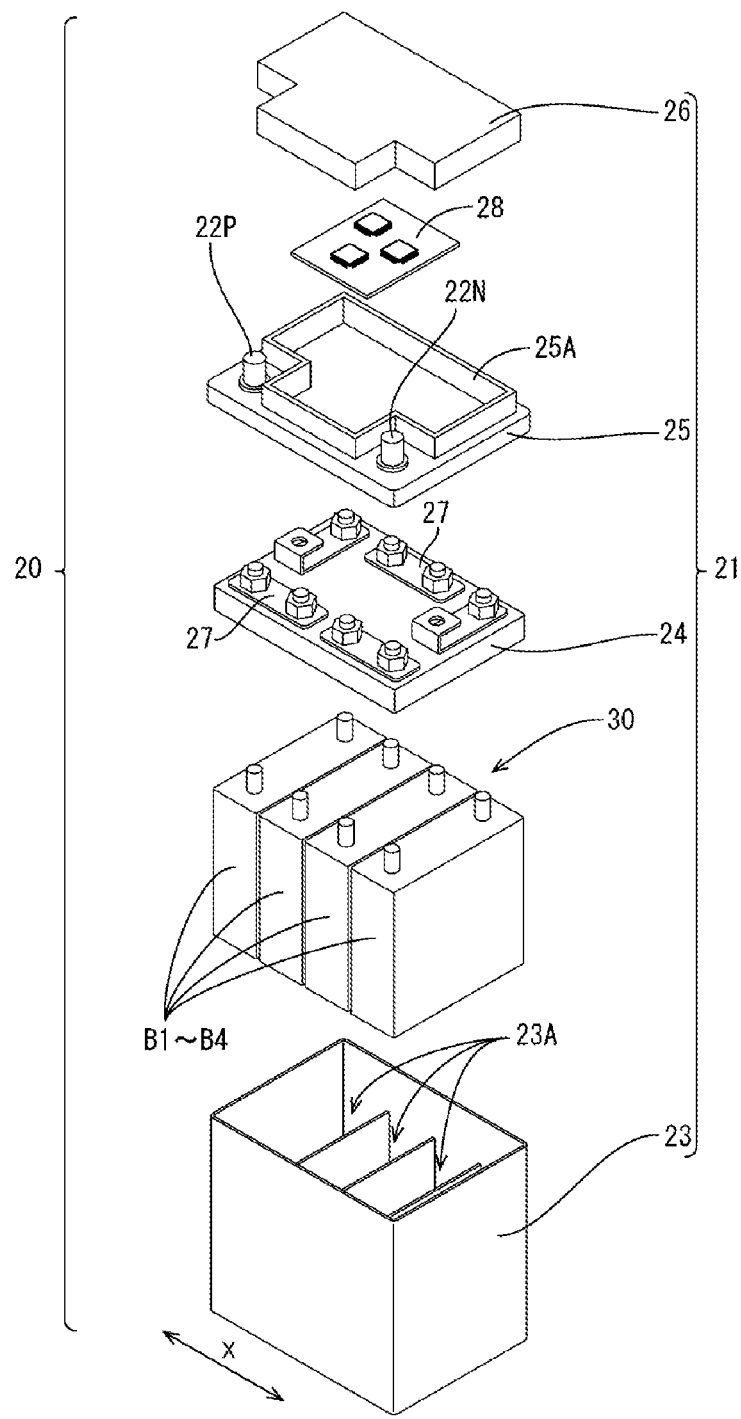
FIG. 3 is an exploded perspective view of the battery.
Figure 4:
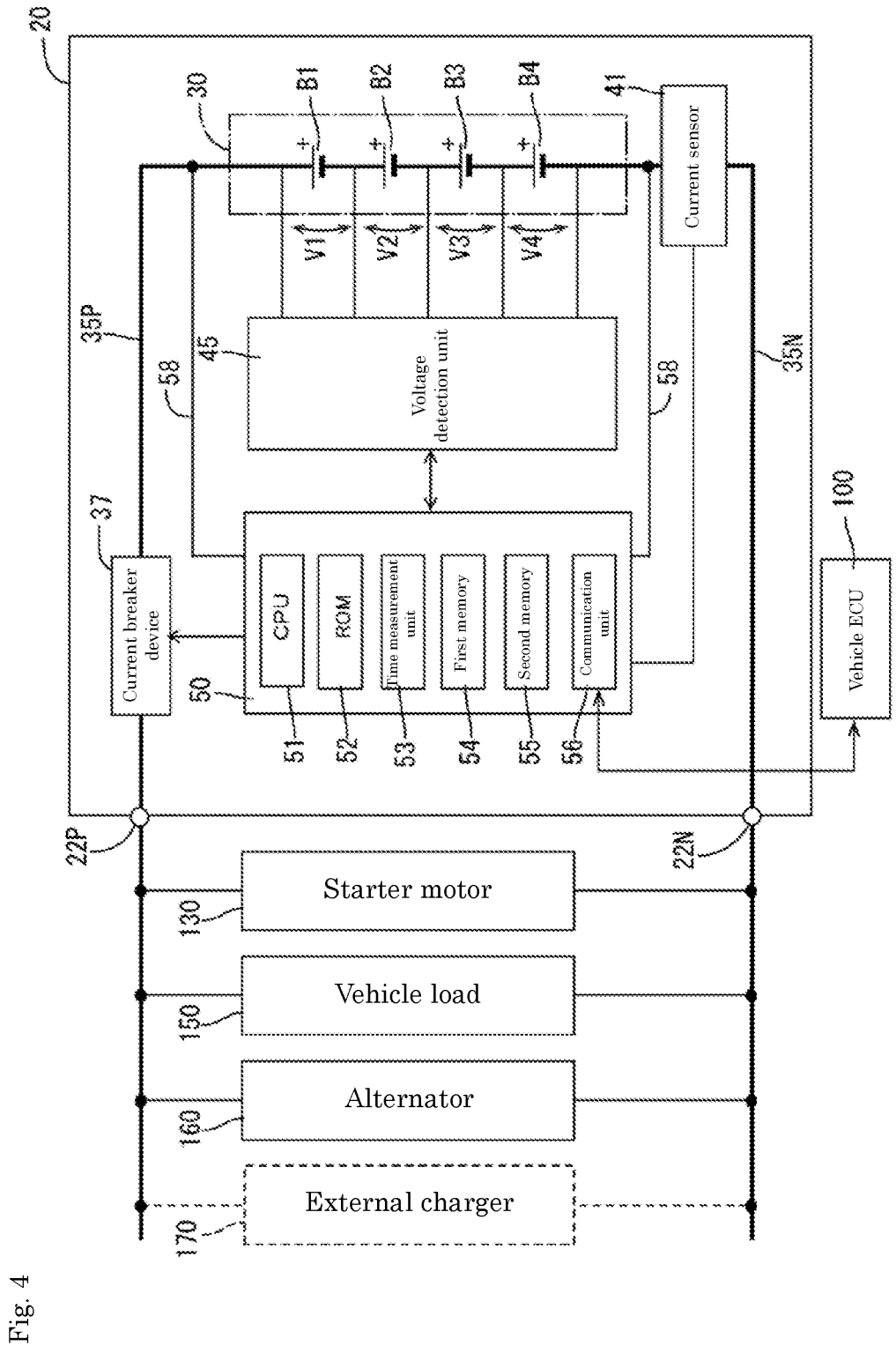
FIG. 4 is a block diagram showing an electrical configuration of a battery according to a first embodiment.

FIG. 1 is a side view of a vehicle. FIG. 2 is a perspective view of a battery. FIG. 3 is an exploded perspective view of the battery. FIG. 4 is a block diagram showing an electrical configuration of the battery.

A vehicle 1 is an engine-driven vehicle including an engine 3 for driving an axle. As illustrated in FIG. 1, the vehicle 1 includes a battery 20 as an energy storage apparatus. As illustrated in FIG. 2, the battery 20 includes a battery case 21 of a block shape. The battery case 21 accommodates an assembled battery 30 and a control board 28. The assembled battery 30 includes a plurality of secondary batteries B1, B2, B3, and B4.

As illustrated in FIG. 3, the battery case 21 includes a case body 23, a positioning member 24, an inner lid 25, and an upper lid 26. The case body 23 has a box shape and opens upward. The positioning member 24 positions the plurality of secondary batteries B1 to B4. The inner lid 25 is mounted to an upper part of the case body 23. As illustrated in FIG. 3, the case body 23 includes a plurality of cell chambers 23A that are aligned in an X direction and configured to individually accommodate each of the secondary batteries B1 to B4.

As illustrated in FIG. 3, the positioning member 24 has on its upper face a plurality of bus bars 27. The positioning member 24 is disposed on an upper part of the plurality of secondary batteries B1 to B4 in the case body 23. With this configuration, the plurality of secondary batteries B1 to B4 are positioned and connected in series via the plurality of bus bars 27.

As illustrated in FIG. 2, the inner lid 25 has a substantially rectangular shape in plan view. The inner lid 25 has at its both ends in the X direction a pair of terminal portions 22P and 22N, to which a harness terminal (not illustrated) is connected. The pair of terminal portions 22P and 22N are made of, for example, a metal such as a lead alloy. The terminal portion 22P is at a side of a positive electrode and the terminal portion 22N is at a side of a negative electrode.

The inner lid 25 has on its upper face a housing 25A. The control board 28 is accommodated inside the housing 25A on the inner lid 25. When the inner lid 25 is mounted to the case body 23, secondary batteries B and the control board 28 are connected to each other. The upper lid 26 is mounted to an upper part of the inner lid 25 to close an upper face of the housing 25A where the control board 28 is accommodated.

An electrical configuration of the battery 20 will be described with reference to FIG. 4. The battery 20 is an engine starting battery, and includes the assembled battery 30, a current breaker device 37, a current sensor 41, a voltage detection unit 45, and a management device 50. The management device 50 is configured to manage the assembled battery 30.

The assembled battery 30 includes lithium ion secondary batteries B1, B2, B3, and B4, the number of which is four. The lithium ion second batteries B1 to B4 are connected in series to each other. The lithium ion secondary batteries B1 to B4 represent an example of an "energy storage device" according to the present invention.

The assembled battery 30, the current sensor 41, and the current breaker device 37 are connected in series via a current flow path 35P and a current flow path 35N. The current sensor 41 is disposed on the current flow path 35N at the side of the negative electrode, and the current breaker device 37 is disposed on the current flow path 35P at the side of the positive electrode.

The current sensor 41 is connected to the terminal portion 22N at the side of the negative electrode, and the current breaker device 37 is connected to the terminal portion 22P at the side of the positive electrode.

The current sensor 41 is provided inside the battery case 21 and detects a current I flowing through the assembled battery 30. The current sensor 41 is electrically connected to the management device 50 via a signal line, and power from the current sensor 41 is incorporated into the management device 50.

The voltage detection unit 45 is provided inside the battery case 21. The voltage detection unit 45 detects battery voltages V1, V2, V3, and V4 of the respective lithium ion secondary batteries B1, B2, B3 and B4, together with a total voltage Ev of the assembled battery 30. The voltage detection unit 45 is electrically connected to the management device 50 via the signal line, and power from the voltage detection unit 45 is incorporated into the management device 50. Each of the current sensor 41 and the voltage detection unit 45 represents an example of a "measurement unit" according to the present invention.

The current breaker device 37 may be a contact switch (mechanical type) such as a relay, or a semiconductor switch, such as an FET or a transistor. The current breaker device 37 may open the current flow path 35P at the side of the positive electrode to block the current.

The management device 50 is provided on the control board 28, and includes a CPU 51 having an arithmetic operation function, a ROM 52, a time measurement unit 53 for measuring time duration, a first memory 54, a second memory 55, a communication unit 56, and the like. In FIG. 4, a power supply line for the management device 50 is denoted with a reference sign 58, and the assembled battery is a power source for the management device 50. The first memory 54 corresponds to a "storage unit" according to the present invention.

Figure 9:
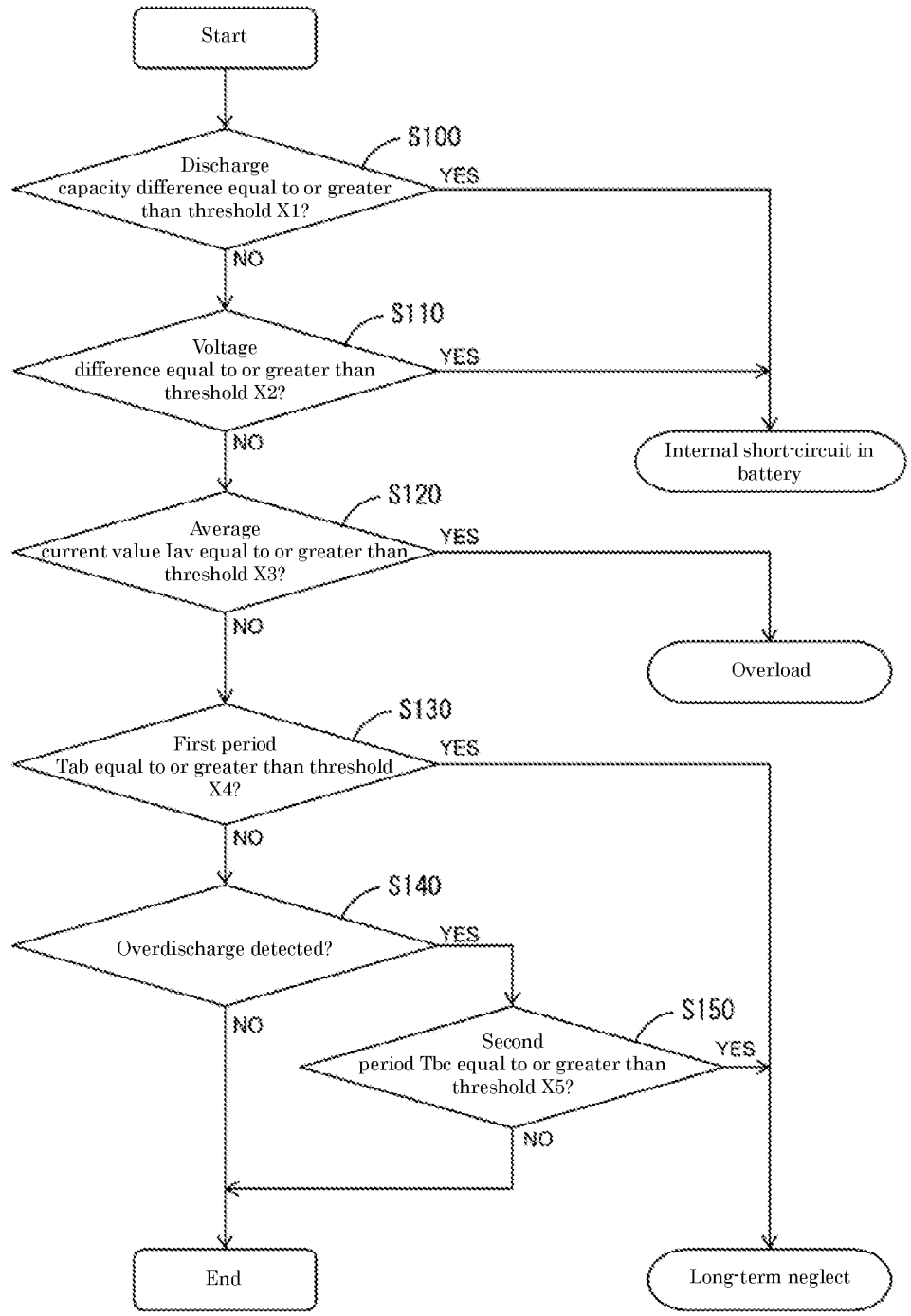
FIG. 9 is a flowchart showing a flow of a cause analysis for analyzing the cause for the execution of the protective operation.

The ROM 52 stores a program for executing a flow of a cause analysis (S100 to S150) shown in FIG. 9. The ROM 52 stores various data for executing the flow of the cause analysis, for example, thresholds X1, X2, X3, X4 and X5. The program may be stored in a storage medium, such as a CD-ROM, to be transferred to others. The first memory 54 is a volatile memory. The second memory 55 is a non-volatile memory and is used for data backup.

The CPU 51 monitors the current I flowing through the assembled battery 30 based on the power from the current sensor 41. Based on the power from the voltage detection unit 45, the CPU 51 monitors voltages V1, V2, V3 and V4 of the respective lithium ion secondary batteries B1, B2, B3, and B4, together with the total voltage Ev of the assembled battery 30. When the current breaker device 37 executes a protective operation after an engine stop, the CPU 51 executes the flow of the cause analysis in FIG. 9 to analyze the cause for the execution of the protective operation. The CPU 51 corresponds to a "cause analysis unit" according to the present invention.

The communication unit 56 is provided for communicating with a vehicle electronic control unit (ECU; hereinafter will be referred to as a vehicle ECU) 100 mounted on the vehicle 1. After mounted on the vehicle, the communication unit 56 is connected to the vehicle ECU 100 via the signal line. Thus, the management device 50 receives from the vehicle ECU 100 information regarding the vehicle such as an operating state (stop or drive) of the engine 3.

As illustrated in FIG. 4, the battery 20 is connected to a starter motor 130 for starting the engine, and each electrical component mounted on the vehicle 1, such as a vehicle load 150 and an alternator 160. The alternator 160 is a vehicular generator configured to generate power using power of the engine 3. During the engine drive mode, when an amount of the power generated by the alternator 160 is greater than an amount of the power consumed by the vehicle load 150, the battery 20 is charged with electricity by the alternator 160.

When the amount of the power generated by the alternator 160 is smaller than the power consumed by the vehicle load 150, the battery 20 discharges to compensate for the power shortage. The alternator 160 stops generating the power during the engine stop. In this state, the power supply to the battery 20 stops (the battery 20 is not charged with electricity), but the battery 20 still discharges to the vehicle load 150.

The battery 20 may be charged with electricity by being connected to an external charger 170 in addition to the alternator 160 mounted on the vehicle.

The battery 20 includes the lithium ion secondary batteries B1 to B4, the current breaker device 37, the current sensor 41, the voltage detection unit 45, and the management device 50. Accordingly, the battery 20 corresponds to an "energy storage apparatus" according to the present invention.

2. Protective Operation by Current Breaker Device

When the lithium ion secondary batteries B1 to B4 are put in an overdischarge state in which the voltages of the lithium ion secondary batteries B1 to B4 fall below an end-of-discharge voltage Vc, copper is eluted from the negative electrode into an electrolyte solution. Then, when each of the lithium ion secondary batteries B1 to B4 is charged with electricity next, the copper precipitated in the corresponding cell chamber may break through a separator to cause an internal short-circuit.

Figure 5:
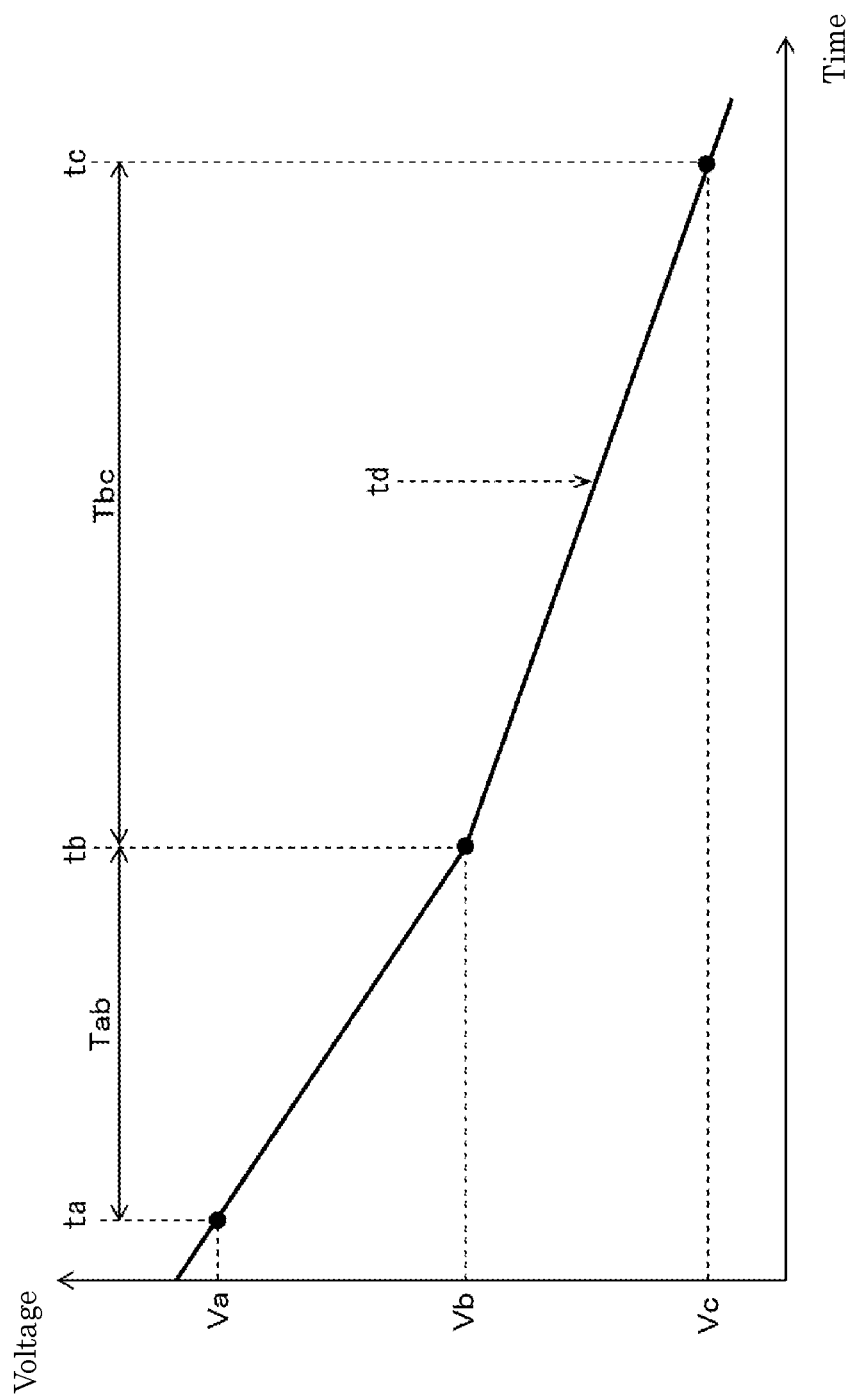
FIG. 5 is a graph showing a change in voltage of a lithium ion secondary battery after an engine stop.

FIG. 5 is a graph showing a temporal change in a minimum voltage Vmin of each of the lithium ion secondary batteries B1 to B4 after the engine stop, with a horizontal axis indicating the time and a vertical axis indicating the voltage. After the engine stop, the vehicle (alternator 160) stops supplying power to the battery 20, and the battery 20 is thus in the discharge state without being charged with electricity. Specifically, in addition to the discharge to the vehicle load 150, the battery 20 discharges to compensate for the current consumed by the management device 50, and self discharges. Accordingly, as illustrated in FIG. 5, the minimum voltage Vmin of the lithium ion secondary batteries B1 to B4 falls as time elapses after time to of the engine stop.

Figure 6:
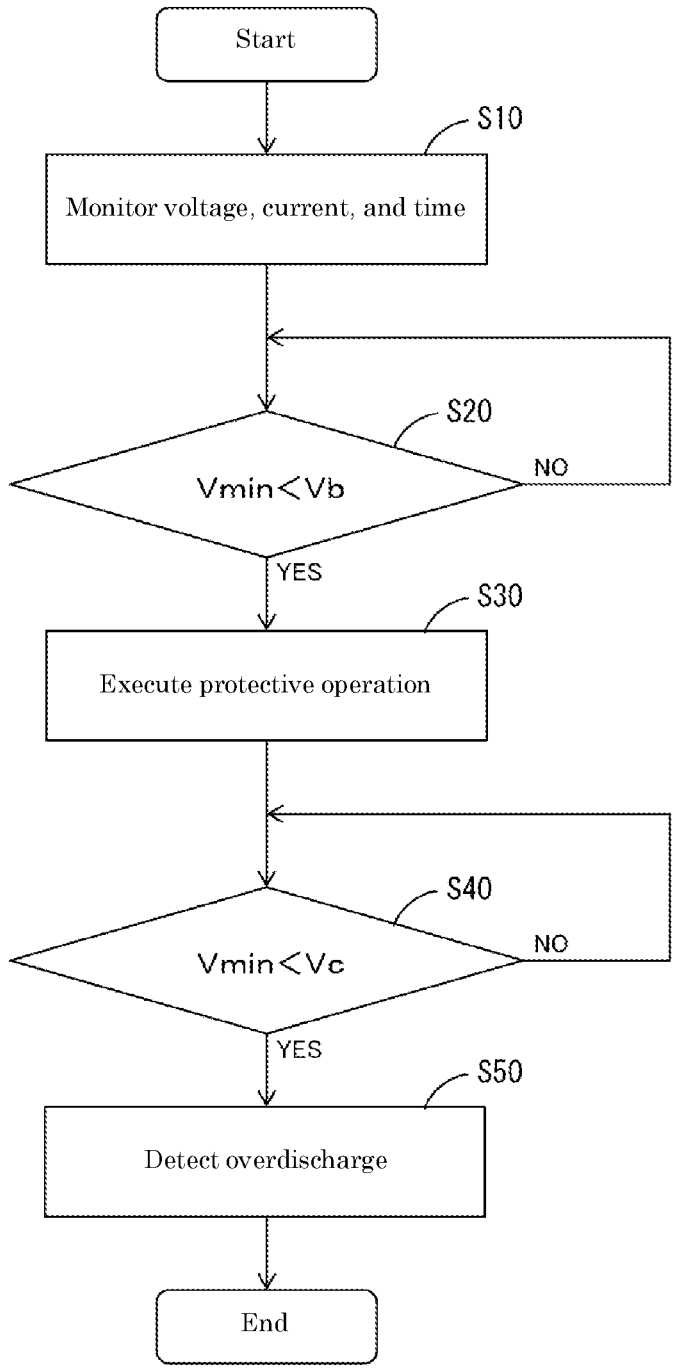
FIG. 6 is a flowchart showing a flow of a battery monitoring process after the engine stop.

After the engine stop, the CPU 51 of the management device 50 undertakes a process of monitoring the voltages V1 to V4 of the respective lithium ion secondary batteries B1 to B4 (S10 in FIG. 6). Then, the CPU 51 compares the minimum voltage Vmin of the lithium ion secondary batteries B1 to B4 with a protective voltage Vb to determine whether or not the minimum voltage Vmin has fallen to the protective voltage Vb. Specifically, the CPU 51 determines whether or not the minimum voltage Vmin is lower than the protective voltage Vb (S20). The protective voltage Vb represents an example of a "predetermined voltage" according to the present invention.

When the minimum voltage Vmin of the lithium ion secondary batteries B1 to B4 has fallen below the protective voltage Vb (S20: YES), the CPU 51 immediately executes the protective operation (S30). Specifically, the CPU 51 gives a command to the current breaker device 37 to open the current flow path 35P so as to block the current flowing from the lithium ion secondary batteries B1 to B4. This configuration prevents the lithium ion secondary batteries B1 to B4 from being put in the overdischarge state, in other words, from falling below the end-of-discharge voltage Vc. This configuration satisfies relationships of the protective voltage Vb >the end-of-discharge voltage Vc.

As illustrated in FIG. 5, after the execution of the protective operation (after time tb), the voltage falls less rapidly, but the lithium ion secondary batteries B1 to B4 still continue to discharge to the management device 50 and continue to self discharge. Thus, the minimum voltage Vmin of the lithium ion secondary batteries B1 to B4 falls as time elapses even after the execution of the protective operation (after the time tb).

Accordingly, even after the execution of the protective operation, the CPU 51 of the management device 50 continues to monitor the voltages V1 to V4 of the respective lithium ion secondary batteries B1 to B4 along with the current I flowing from the lithium ion secondary batteries B1 to B4. When the minimum voltage Vmin of the lithium ion secondary batteries B1 to B4 reaches the end-of-discharge voltage Vc (S40: YES), the CPU 51 determines the battery 20 is in the overdischarge state (S50).

3. Cause Analysis for Execution of Protective Operation.

As has been described above, when the minimum voltage Vmin of the lithium ion secondary batteries B1 to B4 reaches the protective voltage Vb, the CPU 51 of the management device 50 immediately executes the protective operation to block the current. The cause for the execution of the protective operation (cause for the fall in the minimum voltage Vmin to the protective voltage Vb) is presumed to be the internal short-circuit in the battery 20, an overload of the vehicle 1, or a long-term neglect of the vehicle 1.

The internal short-circuit refers to a state where the positive electrode and the negative electrode short circuit with each other inside the battery. The overload refers to a state where a load exceeds a set value. For example, in this state, the vehicle load 150 has been increased to cause the load to exceed an initial load (the set value). The long-term neglect refers to a state where the battery 20 has been left for long hours since the power supply stopped. In this example, the vehicle 1 has been left for a long period since the engine stop, without being charged with electricity by the external charger 170.

Based on the voltages V1 to V4 of the respective lithium ion secondary batteries B1 to B4, the current I flowing from the lithium ion secondary batteries B1 to B4, the data for a first period Tab, and the data for a second period Tbc, each obtained after the engine stop, the CPU 51 of the management device 50 identifies the cause for the execution of the protective operation as which one of the following: the internal short-circuit in the battery 20, the overload of the vehicle 1, or the long-term neglect of the vehicle 1.

<Determination on Internal Short-Circuit in Battery 20>

The CPU 51 of the management device 50 determines whether or not the cause for the execution of the protective operation is the internal short-circuit in the battery 20, based on Determination Formula 1A below and Determination Formula 1B below.

$$Q1ab - Q2ab \geq X1 \quad (1A)$$

Q1ab represents a first discharge capacity that the battery 20 discharges during the first period Tab from the engine stop until the execution of the protective operation. The first discharge capacity Q1ab is obtained by capacity correction on a difference between SOC1 of the lithium ion secondary batteries B at the time to of the engine stop and SOC2 of the lithium ion secondary batteries B at the time tb of the execution of the protective operation. The first period Tab corresponds to a "period from a stop of a power supply until a fall in a voltage of an energy storage device to a predetermined voltage" according to the present invention.

Q1ab=(SOC1−SOC2)×Cbo/100

Cbo represents a full charge capacity of the battery 20.

SOC represents a ratio of a residual capacity Cs of the lithium ion secondary batteries B to the full charge capacity Co of the lithium ion secondary batteries B.

SOC=100×Cs/Co

Cs represents the residual capacity of the lithium ion secondary batteries B, and Co represents the full charge capacity of the lithium ion secondary batteries B.

Figure 7:
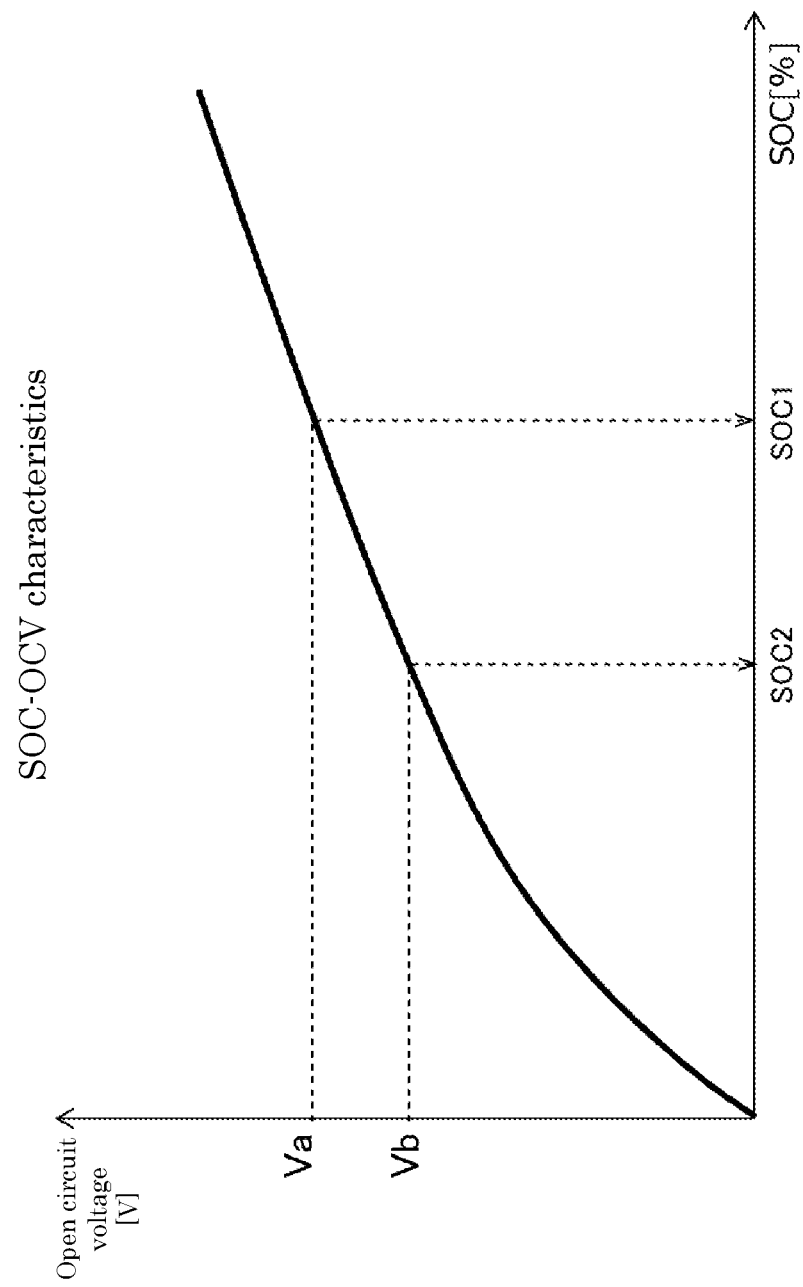
FIG. 7 is a graph showing SOC-OCV characteristics of the lithium ion secondary battery.

It is possible to estimate the SOC using a correlation between an open circuit voltage (OCV) of the lithium ion secondary batteries B and the SOC of the lithium ion secondary batteries B (see FIG. 7). In other words, it is possible to estimate the SOC1 based on an OCV Va of the lithium ion secondary batteries B at the time ta of the engine stop, and it is possible to estimate the SOC2 based on an OCV Vb of the lithium ion secondary batteries B at the time tb of the execution of the protective operation. Each of the OCVs, Va and Vb, may employ a lowest voltage of OCVs V1 to V4 of the respective lithium ion secondary batteries B1 to B4.

The OCV is preferably a voltage V in a no-current state, but may be a voltage in a state where a current equal to or below a current threshold flows (state where only a current at a similar level to the no-current state flows). In a case that a current at the time ta of the engine stop is large, the OCVs V1 to V4 of the respective lithium ion secondary batteries B1 to B4 may be measured later when the current has fallen below the current threshold.

Q2ab represents a second discharge capacity that the battery 20 discharges to the vehicle 1 as the load during the first period Tab from the engine stop until the execution of the protective operation. The second discharge capacity Q2ab is obtained by integrating a current value detected by the current sensor 41 during the first period Tab from the engine stop until the execution of the protective operation.

When the internal short-circuit occurs in the battery 20, the discharge capacity Q1ab is increased. In this state, a difference between the discharge capacity Q1ab and the discharge capacity Q2ab is larger than the difference between the discharge capacity Q1ab and the discharge capacity Q2ab when the internal short-circuit does not occur. Accordingly, based on the Determination Formula 1A above, it is possible to determine whether or not the cause for the execution of the protective operation is the internal short-circuit in the battery 20. X1 represents a capacity difference threshold for determining whether or not the internal short-circuit occurs in the battery 20. The X1 uses as its unit an ampere-hour.

$$V\text{max}\_tb - V\text{min}\_tb > X2 \quad (1B)$$

"Vmax_tb" represents a maximum voltage of the lithium ion secondary batteries B1 to B4 at the time tb of the execution of the protective operation. "Vmin)_tb" is the minimum voltage of the lithium ion secondary batteries B1 to B4 at the time tb of the execution of the protective operation.

When the internal short circuit occurs, the voltages of the lithium ion secondary batteries B1 to B4 fall. In this state, a difference between the maximum voltage Vmax and the minimum voltage Vmin is larger than the difference between the voltage Vmax and the minimum voltage Vmin when the internal short-circuit does not occur. Accordingly, based on the Determination Formula 1B above, it is possible to determine whether or not the cause for the execution of the protective operation is the internal short-circuit in the battery 20. X2 represents a voltage difference threshold for determining whether or not the internal short-circuit occurs in the battery 20. The X2 uses as its unit a volt.

The Determination Formula 1B uses the difference in the voltages and thus results in a small measurement error. Accordingly, it is possible to accurately determine whether or not the cause for the execution of the protective operation is the internal short-circuit in the battery 20.

<Determination on Overload of Vehicle>

The CPU 51 of the management device 50 determines whether or not the cause for the execution of the protective operation is the overload of the vehicle 1, based on Determination Formula 2 below.

$$Iav > X3 \quad (2)$$

Iav represents an average current value from the battery 20 (average value of the current flowing from the battery 20 to the vehicle 1) during the first period Tab from the engine stop until the execution of the protective operation. The average current value Iav from the battery 20 is obtained by dividing the discharge capacity Q2ab to the vehicle by the first period Tab.

When the vehicle 1 is overloaded, the current flowing from the battery 20 to the vehicle 1 exceeds a presumed value. Accordingly, based on the Determination Formula 2 above, it is possible to determine whether or not the cause for the execution of the protective operation is the overload of the vehicle. X3 represents the current threshold for determining whether or not the vehicle is overloaded. For example, in a vehicle in which a load is standardly installed, the X3 corresponds to a magnitude of the current I flowing from the battery 20 to the vehicle 1 during the engine stop.

<Determination on Long-Term Neglect>

The CPU 51 of the management device 50 determines whether or not the cause for the execution of the protective operation is the long-term neglect of the vehicle 1 based on Determination Formula 3A below. The CPU 51 of the management device 50 determines whether or not the cause for the overdischarge is the long-term neglect of the vehicle, based on Determination Formula 3B below.

$$Tab \geq X4 \quad (3A)$$

$$Tbc \geq X5 \quad (3B)$$

The Tab represents the first period actually measured from the engine stop until the execution of the protective operation. X4 represents a time threshold for determining whether or not the vehicle has been left for an appropriate period of time since the engine stop. The X4 is obtained by, for example, by dividing the discharge capacity Q1ab from the battery 20 by a presumed discharge current Iab (X4=Q1ab/Iab).

The discharge capacity Q1ab represents a difference in a capacity of the battery 20 between the time to of the engine stop and the time tb of the execution of the protective operation. The presumed discharge current Iab represents a presumed value of the current discharged from the battery 20 during the period from the engine stop until the execution of the protective operation. The presumed discharge current Iab corresponds, as an example, to a total value (expected value) of a dark current to the vehicle load 150, a dark current to the management device 50, and a self-discharge current of the battery 20. The dark current represents a current that the battery 20 discharges to the vehicle load 150 and the management device 50 during vehicle parking.

When the first period Tab from the engine stop until the execution of the protective operation is equal to or greater than the threshold X4, the CPU 51 of the management device 50 may determine that the cause for the execution of the protective operation is the long-term neglect of the vehicle.

The Tbc represents the second period actually measured from the execution of the protective operation until the overdischarge. X5 represents a time threshold for determining whether or not the vehicle has been left for the appropriate period of time since the execution of the protective operation. The X5 is obtained by, for example, by dividing a discharge capacity Q1bc from the battery 20 by a presumed discharge current Ibc (X5=Q1bc/Ibc).

The discharge capacity Q1bc from the battery 20 represents a difference in the capacity of the battery 20 between the time tb of the execution of the protective operation and time tc of the overdischarge. The presumed discharge current Ibc represents a presumed value of the current discharged from the battery 20 during the period Tbc from the execution of the protective operation until the overdischarge. The presumed discharge current Ibc corresponds, as an example, to a total value (expected value) of the dark current to the management device 50 and the self-discharge current of the battery 20.

When the second period Tbc from the execution of the protective operation until the overdischarge is equal to or greater than the threshold X5, the CPU 51 of the management device 50 may determine that the cause for the overcharge of the battery 20 is the long-term neglect of the vehicle.

<Cause Analysis Flow>

Figure 8:
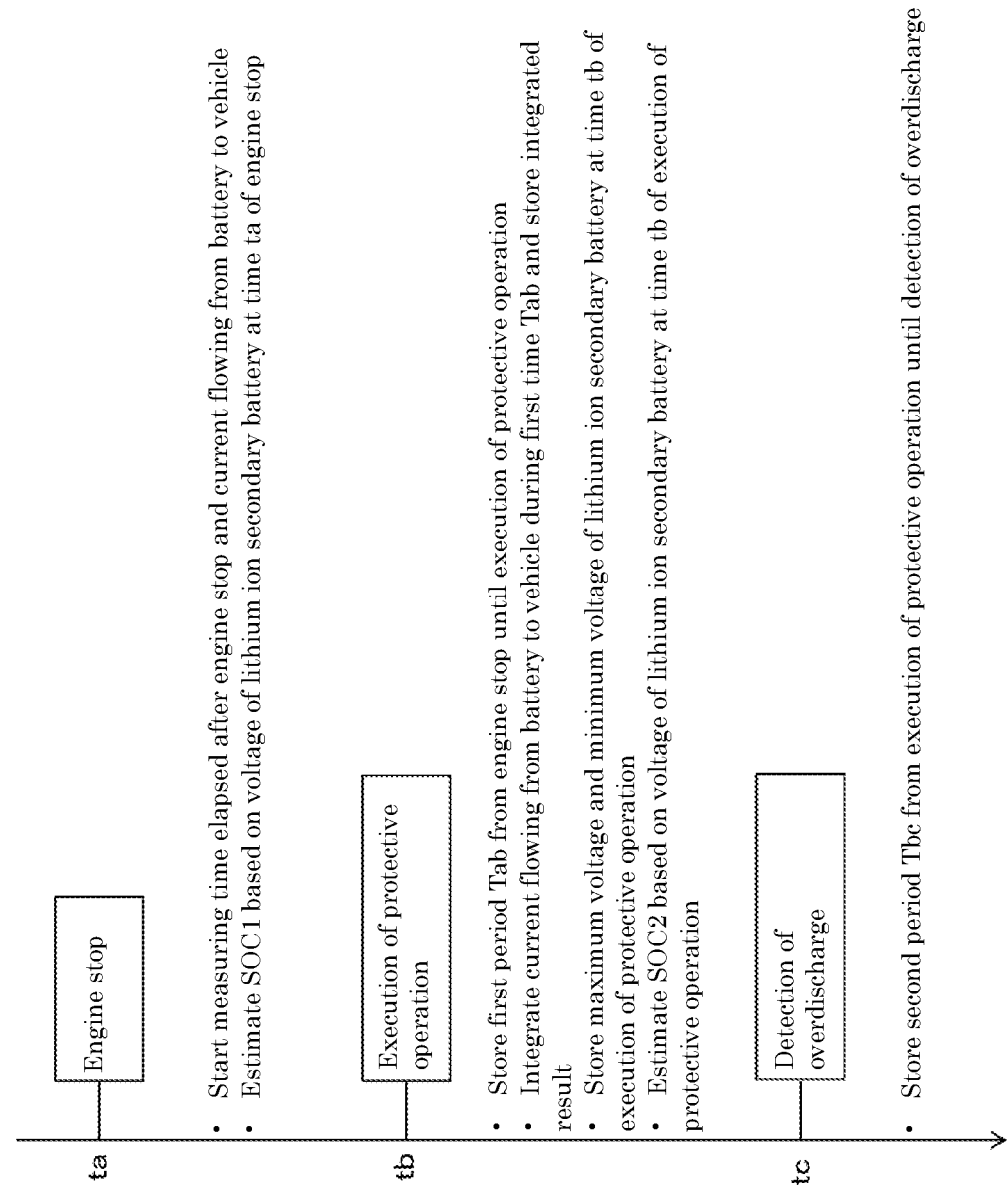
FIG. 8 is a diagram showing data processing for analyzing a cause for execution of a protective operation.

FIG. 8 shows contents of data processing by the CPU 51 of the management device 50 after the engine stop, the data processing for analyzing the cause for the execution of the protective operation (cause for the fall of the minimum voltage Vmin to the protective voltage Vb). Specifically, after the engine stop, the CPU 51 causes the time measurement unit 53 to start measuring time T elapsed from the engine stop. The CPU 51 causes the current sensor 41 to start measuring the current I flowing from the battery 20 to the vehicle 1. The CPU 51 causes the voltage detection unit 45 to detect the voltages V1 to V4 of the respective lithium ion secondary batteries B1 to B4 at the time to of the engine stop. The CPU 51 estimates the SOC1 of the lithium ion secondary batteries B based on the voltages V1 to V4 detected and stores a result estimated in the first memory 54.

After the execution of the protective operation, the CPU 51 stores in the first memory 54 the first period Tab from the engine stop until the execution of the protective operation. The CPU 51 integrates the current I flowing from the battery 20 to the vehicle 1 during the first period Tab and stores a result integrated in the first memory 54. The CPU 51 causes the voltage detection unit 45 to detect the voltages V1 to V4 of the respective lithium ion secondary batteries B1 to B4 at the time tb of the execution of the protective operation, and stores in the first memory 54 the maximum voltage Vmax_tb and the minimum voltage Vmin_tb. The CPU 51 estimates the SOC2 of the lithium ion secondary batteries B based on the voltages V1 to V4 of the respective lithium ion secondary batteries B1 to B4 at the time tb of the execution of the protective operation, and stores a result estimated in the first memory 54.

After the overdischarge is detected, the CPU 51 stores in the first memory 54 the second period Tbc from the execution of the protective operation until the overdischarge detected.

The data processing described above as an example is reset when the management device 50 detects start of charge by the alternator 160 or the external charger 170. After the charge, when the engine 3 of the vehicle 1 stops, the data processing starts again from the beginning.

FIG. 9 is a flowchart for analyzing the cause for the execution of the protective operation. As illustrated in FIG. 9, the cause analysis flow includes S100 to S150. The cause analysis flow is executed by the CPU 51 of the management device 50, for example, at the time tc when the minimum voltage Vmin of the lithium ion secondary batteries B1 to B4 has fallen below the end-of-discharge voltage Vc since the engine stop and thus the overdischarge is detected.

The cause analysis flow is configured to determine the subjects below based on various data obtained by the data processing described above (see FIG. 8).

Specifically, in S100, the CPU 51 of the management device 50 obtains a difference between the first discharge capacity Q1ab from the battery 20 and the second discharge capacity Q2ab from the battery 20 to the vehicle 1 in the first period Tab. Then, the CPU 51 compares the difference obtained between the first discharge capacity Q1ab and the second discharge capacity Q2ab, with the threshold X1 (Determination Formula 1A).

In S110, the CPU 51 obtains a difference between the maximum voltage Vmax_tb of the lithium ion secondary batteries B1 to B4 and the minimum voltage Vmin_tb of the lithium ion secondary batteries B1 to B4, at the time tb of the execution of the protective operation. Then, the CPU 51 compares the difference obtained between the maximum voltage Vmax_tb and the minimum voltage Vmin_tb with the threshold X2 (Determination Formula 1B).

When the difference between the first discharge capacity Q1ab and the second discharge capacity Q2ab is equal to or greater than the threshold X1 (S100: YES), or when the difference between the maximum voltage Vmax_tb and the minimum voltage Vmin_tb is equal to or greater than the threshold X2 (S110: YES), the CPU 51 determines that the cause for the execution of the protective operation is the internal short-circuit in the battery 20.

When the difference between the first discharge capacity Q1ab and the second discharge capacity Q2ab is smaller than the threshold X1, and when the difference between the maximum voltage Vmax_tb and the minimum voltage Vmin_tb is smaller than the threshold X2 (NO in both S100 and S110), the CPU 51 moves to S30. In S120, the CPU 51 compares the average current value Iav flowing from the battery 20 to the vehicle 1 during the first period Tab from the engine stop until the execution of the protective operation with the threshold X3 (Determination Formula 2).

When the average current value Iav is equal to or greater than the threshold X3 (S120: YES), the CPU 51 determines that the cause for the execution of the protective operation is the overload.

When the average current value Iav is smaller than the threshold X3 (S120: NO), the CPU 51 moves to S130. In S130, the CPU 51 compares the first period Tab with the threshold X4 (Determination Formula 3A).

When the first period Tab is equal to or greater than the threshold X4 (S130: YES), the CPU 51 determines that the cause for the execution of the protective operation is the long-term neglect.

When the first period Tab is less than the threshold X4 (S130: NO), the CPU 51 determines in S140 whether or not the overdischarge has been detected.

In this example, the CPU 51 executes the cause analysis flow after the overdischarge is detected, and thus the result of S140 is YES. Then, the CPU 51 moves to S150 to compare the second period Tbc with the threshold X5 (Determination Formula 3B).

When the second period Tbc is equal to or greater than the threshold X5 (S150: YES), the CPU 51 determines that the cause for the overdischarge is the long-term neglect. When the second period Tbc is less than the threshold X5 (S150: NO), the CPU 51 determines that the cause is unidentified.

As has been described above, it is possible to identify the cause for the protective operation executed by the current breaker device 37 after the engine stop as which one of the following: the overload of the vehicle 1, the internal short-circuit in the battery 20, the long-term neglect, or the cause unidentified. When the cause is identified, the CPU 51 stores (backs up) the data measured for the cause analysis and the data computed for the cause analysis, together with the cause identified, in the second memory 55 as the non-volatile memory. With this configuration, even when the management device 50 loses its power source, it is possible to retrieve the data from the second memory 55 to identify the cause for the protective operation executed by the current breaker device 37 after the engine stop as which one of the following: the overload of the vehicle 1, the internal short-circuit in the battery 20, the long-term neglect, or the cause unidentified.

When the cause is identified, and when capable of communicating with the vehicle ECU 100 via the communication unit 56, the CPU 51 preferably notifies the vehicle that the battery 20 is in the overdischarge state and what causes the execution of the protective operation after the engine stop.

The CPU 51 executes the cause analysis flow not only after the overdischarge is detected but may also execute the cause analysis flow before the overdischarge is detected, as long as the protective operation has been executed since the engine stop.

For example, at time td after the execution of the protective operation, when the external charger 170 is connected to the battery 20, the CPU 51 detects the connection of the external charger 170 based on a change in voltage of each of the terminal portions 22P and 22N. Then, the CPU 51 causes the current breaker device 37 to return to a closed state from an open state. As a result, the battery 20 is charged with electricity by the external charger 170.

When the CPU 51 detects the connection of the external charger 170, the CPU 51 may execute the cause analysis flow based on the data measured during the first period Tab from the engine stop until the execution of the protective operation.

When the CPU 51 executes the cause analysis based on the data measured during the first period Tab, S140 is determined as NO, and thus the CPU 51 executes only four determination steps from S100 to S130.

With the battery 20 having been charged with electricity by the external charger 170, when capable of communicating with the vehicle ECU 100 via the communication unit 56, the CPU 51 of the management device 50 notifies the vehicle 1 of the cause for the execution of the protective operation after the engine stop. When not capable of notifying the vehicle 1, the CPU 51 stores the data measured for the cause analysis along with the cause identified (result of the analysis) in the second memory 55 as the non-volatile memory.

4. Description of Effects

In this configuration, it is possible to analyze the cause for the execution of the protective operation (cause for the fall in the minimum voltage Vmin of the lithium ion secondary batteries B to the protective voltage Vb) after the engine stop. Accordingly, it is possible to prompt a user to take a countermeasure in accordance with the cause.

As an appropriate countermeasure in accordance with the cause, when the overload is the cause, a supplier of the battery 20 may prompt the user to reduce the vehicle load 150. When the internal short-circuit is the cause, the supplier of the battery 20 may prompt the user to replace the battery 20. When the long-term neglect is the cause, the warning may be given to the user to leave the vehicle for the shorter period.

The management device 50 analyzes the cause for the execution of the protective operation based on the data measured after the engine stop. Accordingly, even without the data obtained regarding the current or the voltage of the lithium ion secondary batteries B1 to B4 during the vehicle running, the management device 50 may analyze the cause for the execution of the protective operation after the engine stop. Further, the management device 50 is not required to store the data obtained before the engine stop and thus gains a benefit, such as saving data capacity in the first memory 54 and the second memory 55.

Second Embodiment

Figure 10:
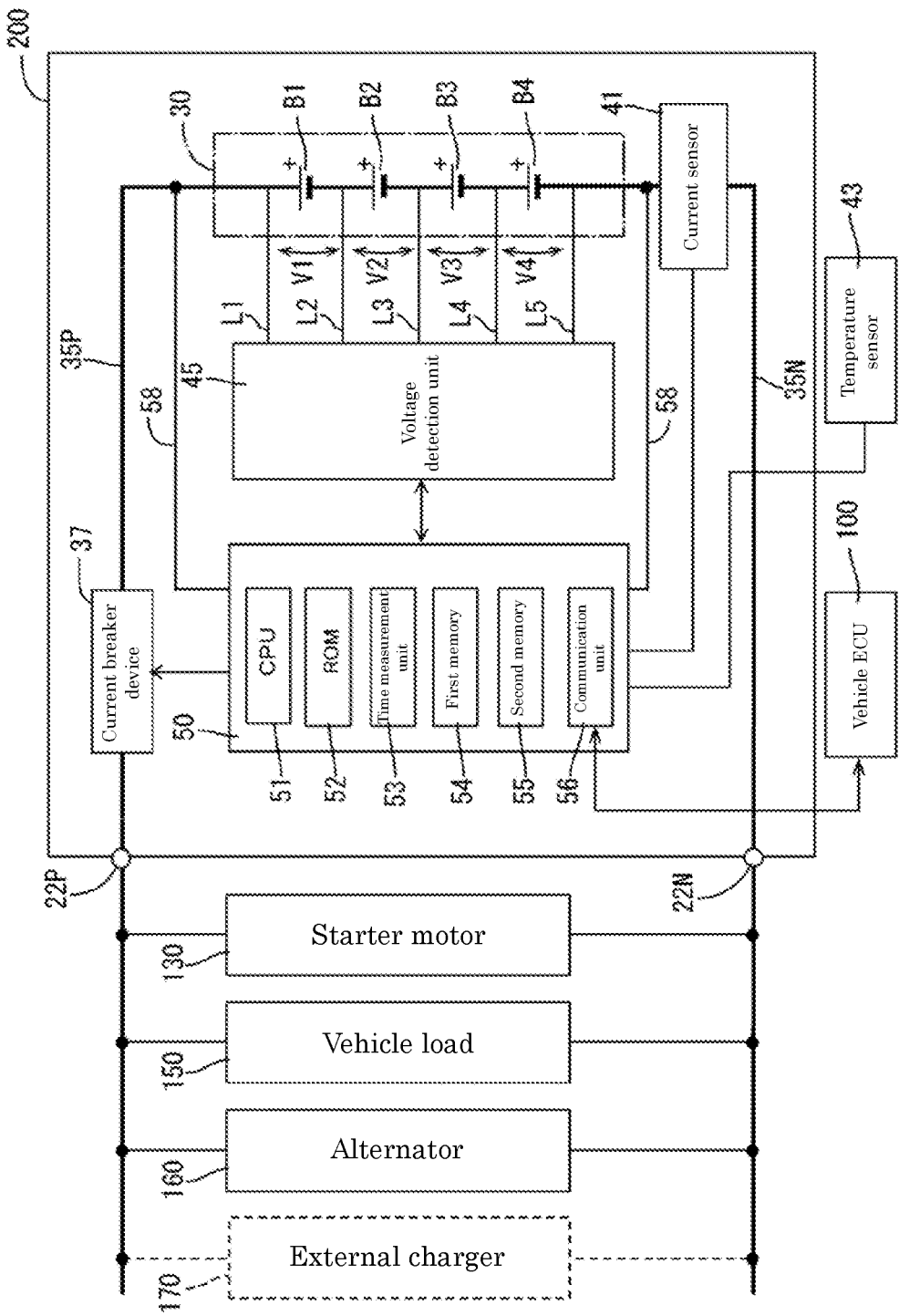
FIG. 10 is a block diagram showing an electrical configuration of a battery according to a second embodiment.

FIG. 10 is a block diagram showing an electrical configuration of a battery 200. Similarly to the battery 20 in the first embodiment, the battery 200 is an engine starting battery, and includes the assembled battery 30, the current breaker device 37, the current sensor 41, the voltage detection unit 45, and the management device 50. The management device 50 is configured to manage the assembled battery 30.

The battery 200 also includes a temperature sensor 43. The temperature sensor 43 is configured to detect an environmental temperature of a location where the battery 200 is installed. The battery 200 is installed in a trunk room (not shown) of the vehicle 1. The temperature sensor 43 detects the temperature of the trunk room as the environmental temperature surrounding the battery 200.

Figure 11:
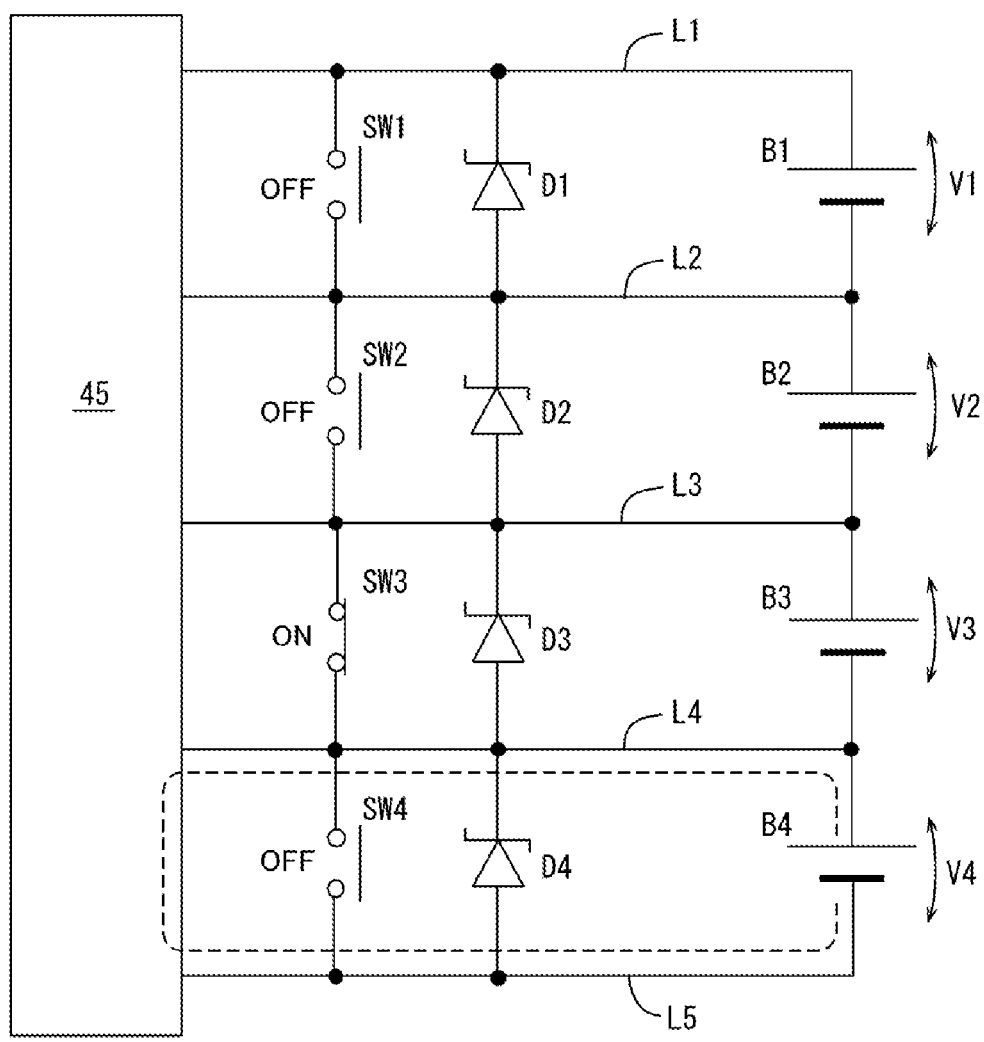
FIG. 11 is a detailed view of a voltage measurement line.

FIG. 11 is a detailed view of voltage measurement lines for each of the lithium ion secondary batteries B1 to B4. Each of the lithium ion secondary batteries B1 to B4 is connected to the voltage detection unit 45 via corresponding ones of voltage measurement lines L1, L2, L3, L4, and L5. Between each of the voltage measurement lines, Zener diodes D1, D2, D3, and D4 and switches SW1, SW2, SW3, and SW4 are connected in parallel with a corresponding one of the lithium ion secondary batteries B1, B2, B3, and B4.

The CPU 51 of the management device 50 causes each of the switches SW1 to SW4 to turn on from off in a predetermined order, and when the corresponding switch SW is in an off-state and the next switch SW is in an on-state, the voltage detection unit 45 measures a voltage of the corresponding one of the lithium ion secondary batteries B.

When the switches SW1 to SW4 turn on from off in an order of SW3, SW2, SW1, and SW4, and when the SW4 is in the off-state and the SW3 is in the on-state as shown in FIG. 11, the voltage detection unit 45 detects a line voltage between the voltage measurement lines L4 and L5 to measure the voltage V4 of the lithium ion secondary battery B4.

Next, when the SW3 is in the off-state and the SW2 is in the on-state, the voltage detection unit 45 detects a line voltage between L3 and L4 to measure the voltage V3 of the lithium ion secondary battery B3. By following the same procedure as above, it is possible to measure the voltage V2 of the lithium ion secondary battery B2 and measure the voltage V1 of the lithium ion secondary battery B 1.

In a voltage measurement method as described above, when any one of the voltage measurement lines L is disconnected, the measurement results in an abnormal value. As a result, the disconnection of any one of the measurement lines L is detected.

Figure 12:
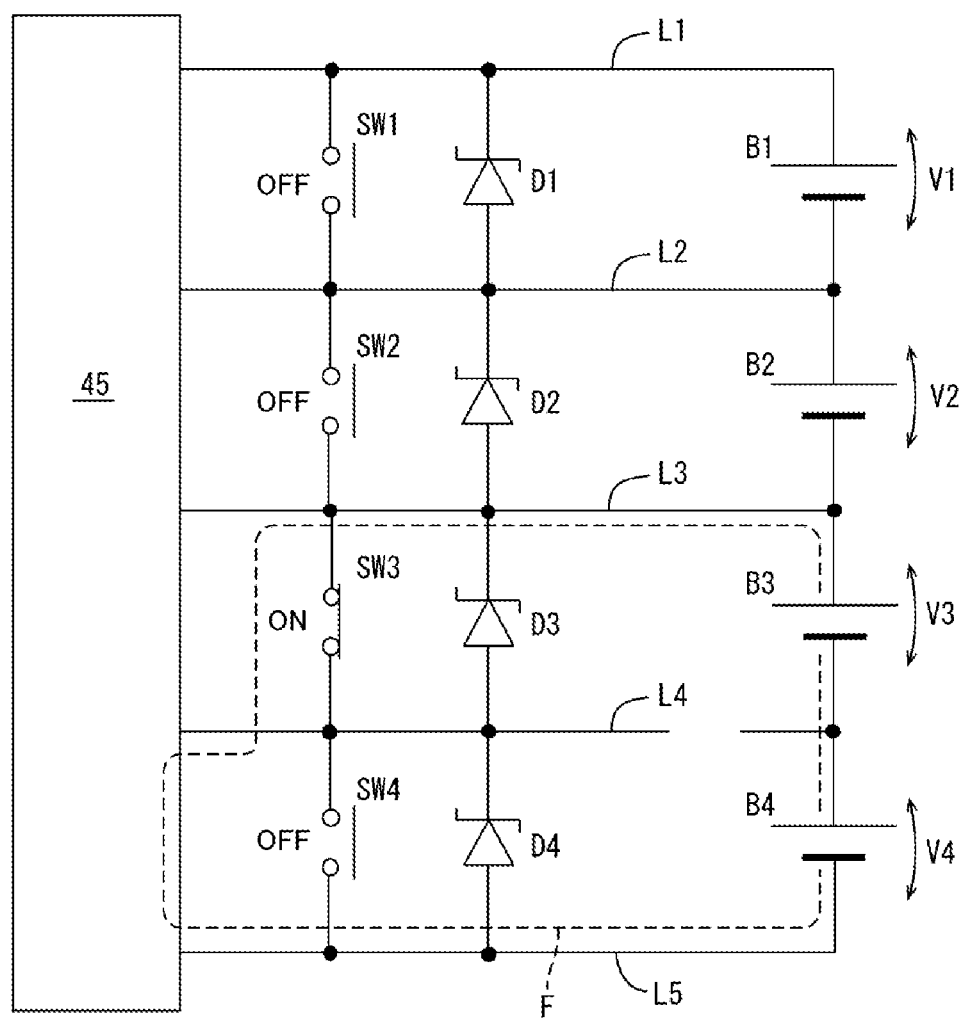
FIG. 12 is a diagram showing a current loop when a part of the voltage measurement line is disconnected.

When measuring the voltage V4 of the lithium ion secondary battery B4, the SW4 is in the off-state and the SW3 is in the on-state. As shown in FIG. 12, when the voltage measurement line L4 is disconnected, the line voltage measured between the measurement lines L4 and L5 results in a total of the voltages V3 and V4 of the respective lithium ion secondary batteries B3 and B4, which is the abnormal value (of approximately 7 V) corresponding to twice as much as a normal value.

Figure 13:
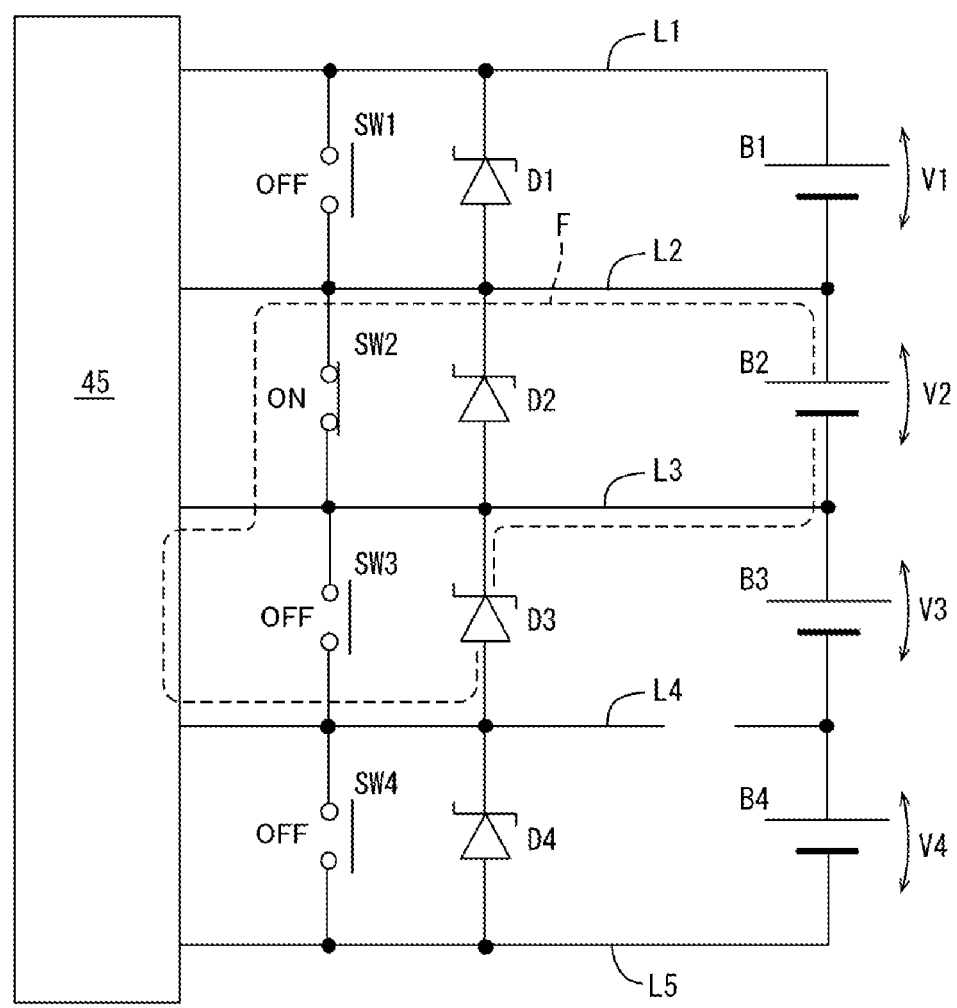
FIG. 13 is a diagram showing a current loop when another part of the voltage measurement line is disconnected.

When measuring the voltage V3 of the lithium ion secondary battery B3, the SW3 is in the off-state and the SW2 is in the on-state. As shown in FIG. 13, when the voltage measurement line L4 is disconnected, a line voltage between the measurement lines L2 and L3 results in a forward voltage of the Zener diode D2 (approximately 0.7 V) that is lower than the normal value. In each of FIGS. 12 and 13, a broken line F indicates a current loop when one of the voltage measurement lines is disconnected.

The CPU 51 compares each of the voltages of the lithium ion secondary batteries B1 to B4 measured by the voltage detection unit 45 with voltage tolerance (of 2 V to 6 V) to determine whether or not any one of the voltages measured includes the abnormal value. As a result, the CPU 51 detects any one of the voltage measurement lines L1to L5 is disconnected.

<Cause Analysis Flow>

The CPU 51 of the management device 50 monitors the voltages of and the current from the lithium ion secondary batteries B1 to B4 after the engine stop. Additionally, the CPU 51 causes the temperature sensor 43 to measure the environmental temperature surrounding the lithium ion secondary batteries B1 to B4 and stores the data measured in the first memory 54. When the CPU 51 detects that any one of the voltage measurement lines L is disconnected during the measurement of the voltages after the engine stop, the CPU 51 of the management device 50 stores the data in the first memory 54.

Figure 14:
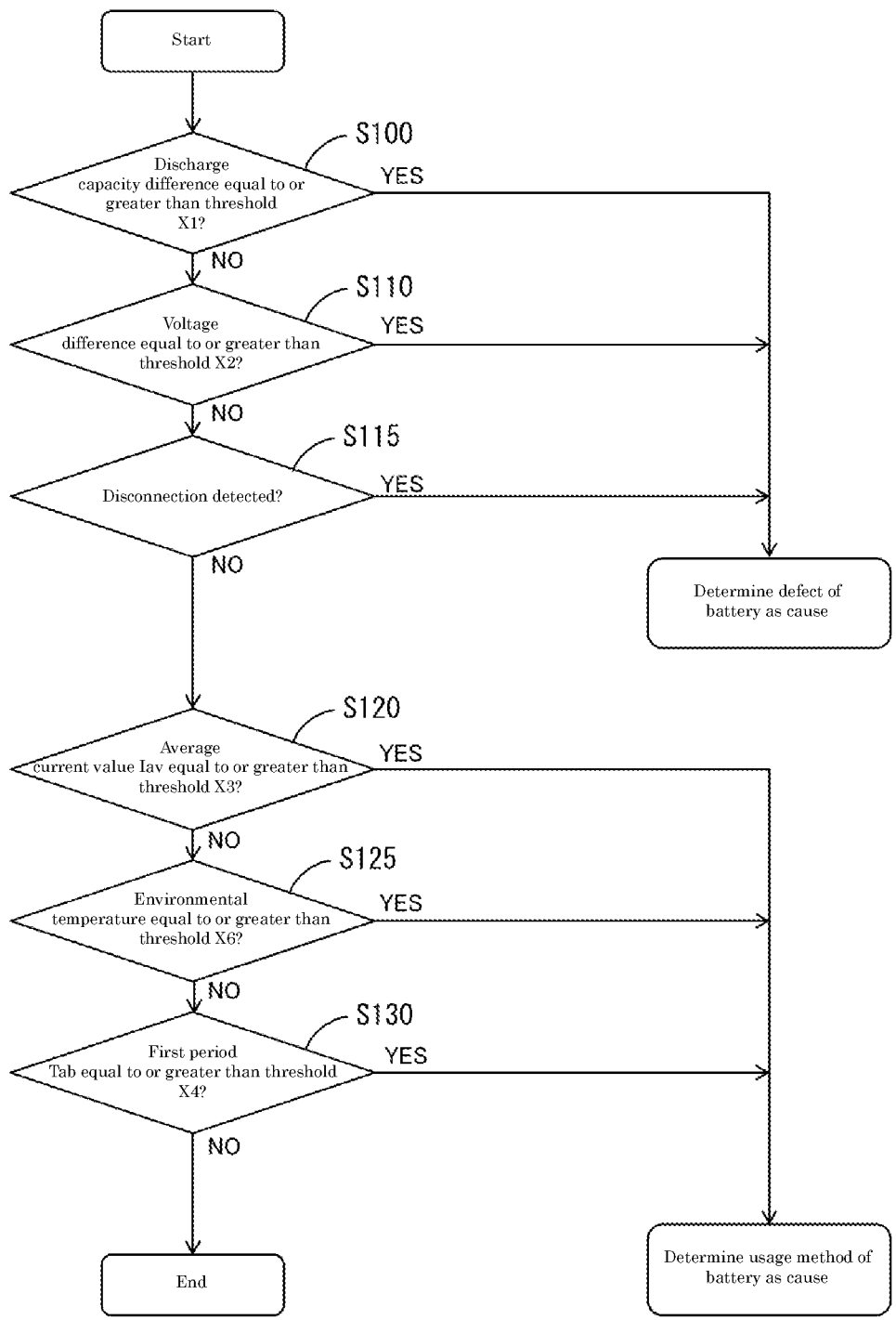
FIG. 14 is a flowchart showing a flow of a cause analysis for analyzing the cause for the execution of the protective operation.

FIG. 14 is a flowchart for analyzing the cause for the execution of the protective operation. The cause analysis flow includes S115 and S125 in addition to the cause analysis flow of the first embodiment (FIG. 9).

In S115, the CPU 51 of the management device 50 determines whether or not the disconnection of any one of the measurement lines L is detected after the engine stop. The CPU 51 of the management device 50 accesses the first memory 54 to determine whether or not the disconnection of any one of the measurement lines L is detected. When any one of the voltage measurement lines L is disconnected, the voltage measured by the voltage detection unit 45 results in a value lower than the normal value. Thus, the CPU 51 determines that the cause for the execution of the protective operation is the disconnection.

In the execution of the protective operation after the engine stop, the CPU 51 executes determination steps of S100, S110, and S115. When any one of the determination steps of S100, S110, and S115 results in YES, the CPU 51 determines that the cause for the execution of the protective operation is a defect of the battery 200 such as the internal short-circuit or the disconnection.

In S125, the CPU 51 determines whether or not an average value of the environmental temperature surrounding the battery 200 is equal to or greater than X6 during the first period Tab from the engine stop until the execution of the protective operation. The X6 is a temperature threshold for determining whether or not the environmental temperature surrounding the battery is appropriate. When the environmental temperature is higher, internal reaction speed of the battery increases, and an amount of the self-discharge of the lithium ion secondary batteries accordingly increases. When the average value of the environmental temperature is equal to or greater than the threshold X6, the CPU 51 may determine that the cause for the execution of the protective operation is a usage of the battery in a higher temperature environment. When the cause for the execution of the protective operation is not the defect of the battery 200, and when any one of the determination steps S120, S125, and S130 results in YES, the CPU 51 determines that the cause for the execution of the protective operation is a usage method (usage mode) of the battery 200, such as the overload, the usage in the higher environment, or the long-term neglect.

In the second embodiment, it is possible to determine whether the cause for the execution of the protective operation after the engine stop is the defect of the battery 200 or the usage method of the battery 200.

Third Embodiment

Figure 15:
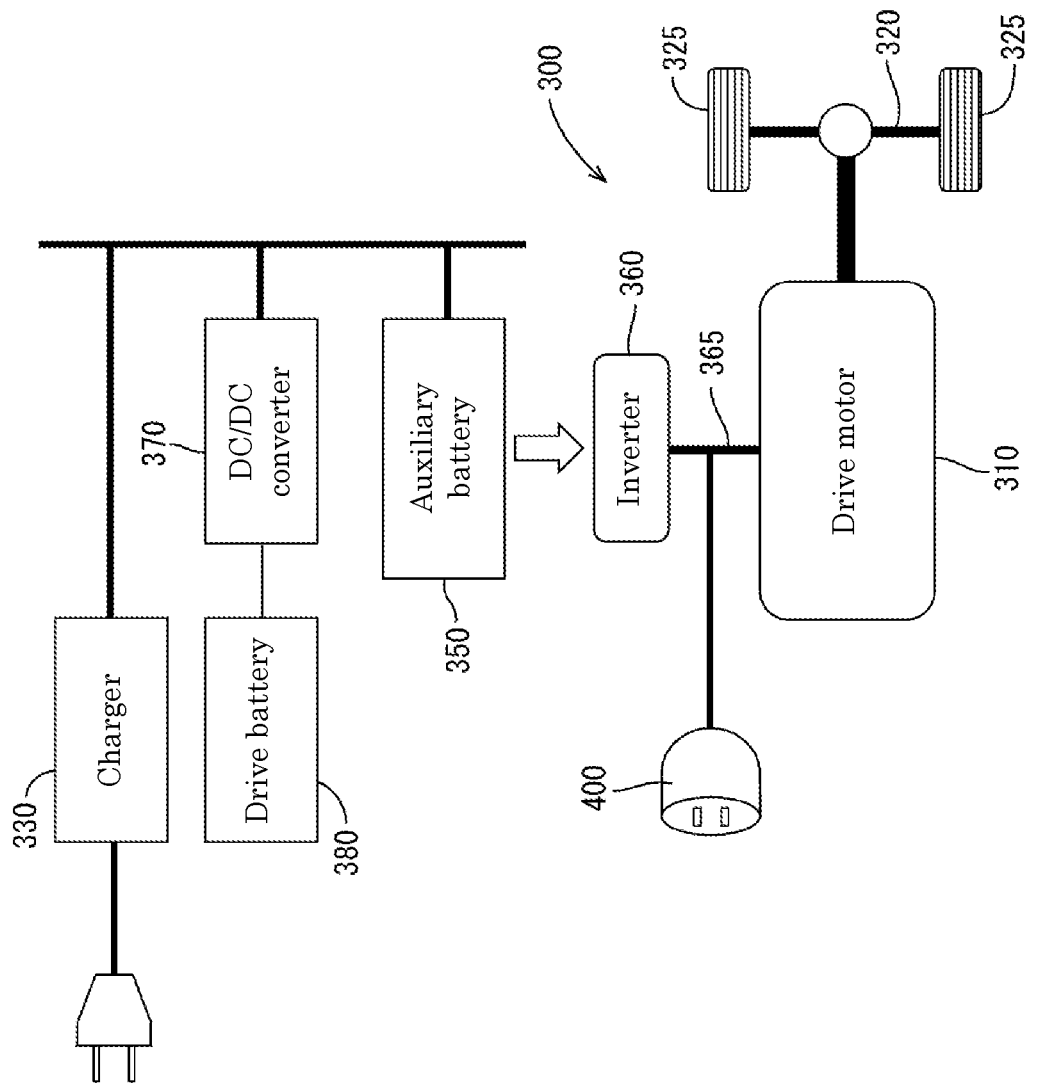
FIG. 15 is a block diagram showing an electrical configuration of an electric vehicle according to a third embodiment.

FIG. 15 is a block diagram of an electric vehicle 300. The electric vehicle 300 includes a drive motor 310, a vehicle-mounted charger 330, a drive battery 350, an inverter 360, a DC/DC converter 370, and an auxiliary battery 380. The vehicle-mounted charger 330 may be charged with electricity by a commercial power source.

The drive battery 350 has a rating of 100 V to 400 V, and may be charged with electricity by the vehicle-mounted charger 200. The drive battery 350 is connected via the inverter 360 to the drive motor 310 that is a main load. The inverter 360 converts power of the drive battery 350 from DC into AC to supply the power converted to the drive motor 310. The drive motor 310 is configured to drive the electric vehicle 300, and drives an axle 320 to which wheels 325 are attached.

The auxiliary battery 380 has a rating of 12 V and is connected to the vehicle-mounted charger 330 via the DC/DC converter 370. The DC/DC converter 370 steps down a voltage of power from the vehicle-mounted charger 200 and supplies power to the auxiliary battery 380 to charge the auxiliary battery 380.

The electric vehicle 300 includes a power supply connector unit 400. The power supply connector unit 400 is branch-connected to a power line 365 that connects the inverter 360 with the drive motor 310. By plugging in the power supply connector unit 400 (not illustrated), the drive battery 350 is used as an emergency power source in a disaster or the like.

In some cases, the drive battery 350 is used as the emergency power source or the like and thus used in an overloaded state. Accordingly, even when the vehicle is in a not-running state, that is, the drive motor 310 (as the main load) is in a stop state, voltage of the drive battery 350 may fall.

The drive battery 350 communicates with a vehicle ECU mounted on the electric vehicle 300 to determine an operating state of the drive motor 310 as the main load. The drive battery 350 internally includes a current sensor, and based on a value measured by the current sensor, the drive battery 350 determines whether or not the drive battery 350 is charged with electricity. With the drive battery 350 to which the present invention is applied, after power supply to the drive battery 350 stops, the data of the drive battery 350 is measured for a period during which the drive motor 310 as the main load stops. The data measured includes: the voltage of the drive battery 350, the current from the drive battery 350, time elapsed after the stop of the drive motor 310, and an environmental temperature surrounding the drive battery 350. Then, when a protective device is operated during the stop period of the drive motor 310, the data measured is post-analyzed so that the cause is determined.

With the drive battery 350 to which the present invention is applied, it is possible to determine whether or not the cause for the operation of the protective device is the usage method of the drive battery 350 such as the overload.

Other Embodiments

In all aspects of the foregoing embodiments and the drawings thereof, it is understood that the present invention is not limited thereto; and thus, for example, the following embodiment will naturally fall within the scope of claims of the present invention.

(1) In the first, second, and third embodiments, the lithium ion secondary batteries B are described as an example of the energy storage device. The energy storage device is not limited to the lithium ion secondary batteries B and may be any other secondary battery. The energy storage device may be a capacitor or the like. In the first embodiment, the plurality of lithium ion secondary batteries B are connected in series but may be a single cell.

(2) In the first and second embodiments, the battery 20 is an engine starting battery but may be a battery for any other purposes, such as an auxiliary battery. When the power supply to the battery 20 has stopped (the battery 20 is in a state of not charged with electricity) and the battery 20 is used as a power source, the battery 20 may be applicable for other purposes in addition to use in vehicles, such as for use as a power source for an electric tool or a computer. When used as the power source for the electric tool or the computer, as long as the power supply to the battery 20 has stopped, the measured data for analyzing a cause for a low voltage fault may be obtained even while the electric tool or the computer is in operation.

(3) In the first and second embodiments, the current breaker device 37 and the management device 50 are provided inside the battery 20. The current breaker device 37 and the management device 50 are not necessarily required to be installed inside the battery 20, and may alternatively be provided outside the battery 20 as long as mounted on the vehicle. In other words, the battery 20 may only include the energy storage device and sensors for measuring the voltage and the current. With this configuration, the current breaker device 37 provided outside the battery may execute the protective operation. The management device 50 provided outside the battery may monitor power from each of the sensors to execute the process of analyzing the cause for the execution of the protective operation. Further, the management device 50 may determine whether or not the protective operation should be executed, not only based on the minimum voltage Vmin of the energy storage devices B1 to B4. The management device 50 may alternatively determine based on the total voltage Ev of the assembled battery 30. The same applies to the determination on the overdischarge.

(4) In the first and second embodiments, when the minimum voltage Vmin of the energy storage devices B1 to B4 has fallen to the protective voltage Vb since the engine stop, the cause is analyzed based on the measured data of the energy storage devices B1 to B4 that has been measured since the engine stop. In addition to the case above, the cause analysis based on the measured data of the energy storage devices B1 to B4 measured after the engine stop may be applied in a case as follows: when a physical quantity that is highly correlated with the voltage (e.g., SOC or a residual capacity of the energy storage devices) has fallen to a predetermined value (the SOC value or the residual capacity value corresponding to the protective voltage Vb). The SOC may be calculated in a current integration method integrating a charge/discharge current of the energy storage devices, or in an OCV method using the correlation between the OCV and the SOC. The residual capacity may be calculated based on the SOC of the energy storage device and the full charge capacity of the energy storage device.

(5) When the minimum voltage Vmin of the energy storage devices B1 to B4 has fallen to the protective voltage Vb, the minimum voltage Vmin is not only below the protective voltage Vb but may also be equal to or nearly equal to the protective voltage Vb. The same applies to when the physical quantity correlated with the voltage falls to the predetermined value.

(6) In the first and second embodiments, the CPU 51 of the management device 50 determines whether or not the minimum voltage Vmin of the energy storage devices B1 to B4 has fallen to the protective voltage Vb. The subject to make the determination above is not limited to the management device 50. The subject may be a control device that is higher in rank than the battery 50, such as the vehicle ECU 100, and the determination made by the control device may be input into the management device 50. Then, the management device 50 may analyze the cause for the fall in the voltage or a cause for the fall in the physical quantity correlated with the voltage.

Here, for example, the vehicle ECU 100 monitors the voltages V of the energy storage devices B1 to B4 and the current I flowing from the energy storage devices B1 to B4, based on the power from each of the sensors provided inside the battery 20. Then, the vehicle ECU 100 determines whether or not the minimum voltage Vmin of the energy storage devices B1 to B4 has fallen to the protective voltage Vb since the engine stop. Similarly to the vehicle ECU 100, the management device 50 is mounted on the vehicle and is disposed outside the battery. When the vehicle ECU 100 determines that the minimum voltage Vmin of energy storage devices B1 to B4 has fallen to the protective voltage Vb, the vehicle ECU 100 inputs the determination into the management device 50. On receipt of the determination input, the management device 50 undertakes the process of analyzing the cause based on the measured data of the energy storage devices B1 to B4 that has been measured since the engine stop.

(7) In the first and second embodiments, the cause analysis is applied to identify the cause for the execution of the protective operation by the current breaker device 37, in other words, the cause for the fall of the minimum voltage Vmin of the energy storage devices B1 to B4 to the protective voltage Vb. When designed to identify the cause for the fall in the voltages of the energy storage devices after the engine stop to the predetermined voltage, the cause analysis may be widely applicable. For example, the cause analysis may be applied to identify a cause for a fall in the voltages of the energy storage devices to a lower limit voltage in a usable range or to the end-of-discharge voltage.

(8) In the first embodiment, the cause for the execution of the protective operation is determined as any one of the following: the internal short-circuit (S100 or S110), the overload (S120), and the long-term neglect (S130 or S140). In the second embodiment, the cause for the execution of the protective operation is determined as any one of the following: the disconnection (S115), the environmental temperature (S125), in addition to the internal short-circuit (S100 or S110), the overload (S120), and the long-term neglect (S130 or S140). In determining the cause for the execution of the protective operation, it is not required to take the determination steps on all these five items: the internal short-circuit, the overload, the long-term neglect, the disconnection, and the environmental temperature. The determination steps may cover only some of the five items. In addition to the voltage of the energy storage devices, the measured data measured after the engine stop may include at least any one of the following: the current from the energy storage devices, the environmental temperature surrounding the energy storage devices, and the time elapsed after the engine stop.

(9) In the first embodiment, in order to determine whether or not the cause for the execution of the protective operation by the current breaker device is the internal short-circuit of the battery, both the Determination Formula 1A and the Determination Formula 1B are used, but alternatively, only one of the Determination Formula 1A and the Determination Formula 1B may be used.

(10) In the second embodiment, when the protective operation is executed after the engine stop, the CPU 51 determines whether or not the cause for the execution of the protective operation is the defect of the battery 200 based on the results of the determination steps, S100, S110, and S115. The CPU 51 also determines whether or not the cause for the execution of the protective operation is the usage method of the battery 200 based on the results of the determination steps, S120, S125, and S130. Here, the determination steps of S100, S110, and S115 may be omitted. Thus, when the protective operation is executed after the engine stop, the CPU 51 may only execute the determination steps of S120, S125, and S130. When any one of S120, S125, and S130 results in YES, the CPU 51 may determine that the cause for the execution of the protective operation is the usage method of the battery 200; and when all S120, S125, and S130 result in NO, the CPU 51 may determine that the cause for execution of the protective operation is not the usage method of the battery 200. Alternatively, the determination steps of S120, S125, and S130 may be omitted. Here, when the protective operation is executed after the engine stop, the CPU 51 may only execute the determination steps of S100, S110, and S115. When any one of S100, S110, and S115 results in YES, the CPU 51 may determine that the cause for the execution of the protective operation is the defect of the battery 200; and when all S100, S110, and S115 result in NO, the CPU 51 may determine that the cause for the execution of the protective operation is not the defect of the battery 200.

(11) Techniques disclosed in the first to third embodiments may be provided in various aspects, such as an analysis program for analyzing a cause for a fall in a voltage of an energy storage device, and a storage medium or the like for storing the analysis program.

Provided is a cause analysis program to cause a computer to execute the cause analysis process (S100 to S150 or S100 to S130) for analyzing the cause for the fall in the voltage of the energy storage device or the cause for the fall in the physical quantity correlated with the voltage. The cause analysis program is configured, when the voltage of the energy storage device falls to the predetermined voltage after the stop of the power supply to the energy storage device or when the physical quantity correlated with the voltage falls to the predetermined value after the stop of the power supply to the energy storage device, to analyze the cause for the fall in the voltage of the energy storage device to the predetermined voltage or the cause for the fall in the physical quantity correlated with the voltage to the predetermined value, based on the measured data of the energy storage device, the measured data measured after the stop of the power supply to the energy storage device.

20 . . . battery (corresponding to a "power storage system" according to the present invention)
30 . . . assembled battery
37 . . . current breaker device
41 . . . current sensor (corresponding to a "measurement unit" according to the present invention)
43 . . . temperature sensor (corresponding to the "measurement unit" according to the present invention)
45 . . . voltage detection unit (corresponding to the "measurement unit" according to the present invention)
50 . . . management device
51 . . . CPU (corresponding to a "cause analysis unit" according to the present invention)
100 . . . vehicle ECU
Va . . . voltage at engine stop
Vb . . . protective voltage (an example of a "predetermined voltage" according to the present invention)
Vc . . . end-of-discharge voltage
Tab . . . first period
Tbc . . . second period

The invention claimed is:

1. A management device for an energy storage device, the management device comprising:
a cause analysis unit configured to, in a case when a voltage of the energy storage device falls to a predetermined voltage after a stop of a power supply to the energy storage device and due to a continued discharge, or in a case when a physical quantity correlated with the voltage falls to a predetermined value after the stop of the power supply to the energy storage device and due to a continued discharge, analyze a cause for a fall in the voltage of the energy storage device to the predetermined voltage or a cause for a fall in the physical quantity correlated with the voltage to the predetermined value, the analyzing being based on measured data of the energy storage device, the measured data being measured after the stop of the power supply to the energy storage device and during the continued discharge.

2. The management device according to claim 1, wherein the cause analysis unit is configured to determine whether or not the cause for the fall in the voltage of the energy storage device to the predetermined voltage or the cause for the fall in the physical quantity correlated with the voltage to the predetermined value is a usage method of the energy storage device.

3. The management device according to claim 2, wherein the cause analysis unit is configured,
in any one of cases:
when a current from the energy storage device measured after the stop of the power supply is greater than a current threshold;
when an environmental temperature of the energy storage device measured after the stop of the power supply is greater than a temperature threshold; or
when time elapsed from the stop of the power supply until the fall in the voltage of the energy storage device to the predetermined voltage or time elapsed from the stop of the power supply until the fall in the physical quantity correlated with the voltage to the predetermined value is greater than a time threshold,
to determine that the cause for the fall in the voltage of the energy storage device to the predetermined voltage or the cause for the fall in the physical quantity correlated with the voltage to the predetermined value is the usage method of the energy storage device.

4. The management device according to claim 1, further comprising:
a storage unit configured to store the measured data of the energy storage device after the stop of the power supply to the energy storage device.

5. The management device according to claim 1, wherein:
the measured data of the energy storage device, the measured data measured after the stop of the power supply, includes two or more of the voltage of the energy storage device, a current from the energy storage device, an environmental temperature of the energy storage device, and time elapsed from the stop of the power supply, the two or more including the voltage of the energy storage device.

6. The management device according to claim 1, wherein:
the cause analysis unit is configured to determine, based on a current flowing from the energy storage device to a load during a period from the stop of the power supply until the fall in the voltage of the energy storage device to the predetermined voltage or during a period from the stop of the power supply until the fall in the physical quantity correlated with the voltage to the predetermined value, whether or not the cause for the fall in the voltage of the energy storage device to the predetermined voltage or the cause for the fall in the physical quantity correlated with the voltage to the predetermined value is an overload.

7. The management device according to claim 1, wherein:
the cause analysis unit is configured:
to calculate, based on data of the voltage of the energy storage device, a first discharge capacity that the energy storage device discharges during a period from the stop of the power supply until the fall in the voltage of the energy storage device to the predetermined voltage or during a period from the stop of the power supply until the fall in the physical quantity correlated with the voltage to the predetermined value;
to calculate, based on data of a current from the energy storage device, a second discharge capacity that the energy storage device discharges to a load during the period from the stop of the power supply until the fall in the voltage of the energy storage device to the predetermined voltage or during the period from the stop of the power supply until the fall in the physical quantity correlated with the voltage to the predetermined value; and to determine, based on a difference between the first discharge capacity calculated and the second discharge capacity calculated, whether or not the cause for the fall in the voltage of the energy storage device to the predetermined voltage or the cause for the fall in the physical quantity correlated with the voltage to the predetermine value is an internal short-circuit of the energy storage device.

8. The management device according to claim 1, wherein:
the energy storage device is provided in a plurality and the plurality of energy storage devices are connected to each other in series, and
the cause analysis unit is configured to determine, based on a difference in the voltages between the energy storage devices at a time point of the falls in the voltages of the energy storage devices to the predetermined voltages or at a time point of the falls in the physical quantities correlated with the voltages to the predetermined values, whether or not the cause for the falls in the voltages of the energy storage devices to the predetermined voltages or the cause for the falls in the physical quantities correlated with the voltages to the predetermined values is an internal short-circuit of the energy storage devices.

9. The management device according to claim 1, wherein:
the device further comprises a time measurement unit configured to measure time duration, and
the cause analysis unit is configured to determine, based on a period from the stop of the power supply until the fall in the voltage of the energy storage device to the predetermined voltage or a period from the stop of the power supply until the fall in the physical quantity correlated with the voltage to the predetermined value, whether or not the cause for the fall in the voltage of the energy storage device to the predetermined voltage or the cause for the fall in the physical quantity correlated with the voltage to the predetermined value is a long-term neglect.

10. The management device according to claim 1, wherein:
the predetermined voltage corresponds to a voltage where a current breaker device blocks a current.

11. A cause analysis method comprising the step of:
in a case when a voltage of an energy storage device falls to a predetermined voltage after a stop of a power supply to the energy storage device due to a continued discharge or in a case when a physical quantity correlated with the voltage falls to a predetermined value after the stop of the power supply to the energy storage device due to a continued discharge, analyzing a cause for a fall in the voltage of the energy storage device to the predetermined voltage or a cause for a fall in the physical quantity correlated with the voltage to the predetermined value, the analyzing being based on measured data of the energy storage device, the measured data being measured after the stop of the power supply to the energy storage device and during the continued discharge.

12. An energy storage apparatus comprising:
an energy storage device;
a measurement unit configured to measure a state of the energy storage device;
a current breaker device configured to block a current from the energy storage device; and
the management device according to claim 1.

13. The energy storage apparatus according to claim 12, being mounted on an engine-driven vehicle including an engine for driving, wherein:
the cause analysis unit is configured, in a case when a voltage of the energy storage device falls to a predetermined voltage after a stop of the engine, or in a case when a physical quantity correlated with the voltage falls to a predetermined value after the stop of the engine, to analyze a cause for a fall in the voltage of the energy storage device to the predetermined voltage or a cause for a fall in the physical quantity correlated with the voltage to the predetermined value, based on measured data of the energy storage device, the measured data measured after the stop of the engine.

14. The energy storage apparatus according to claim 13, being mounted on an electric vehicle including a drive motor for driving and corresponding to a drive battery for supplying power to the drive motor, wherein:
the cause analysis unit is configured, in a case when the voltage of the energy storage device falls to the predetermined voltage during a period that the drive motor is in a stop state after a stop of charge of the energy storage device or in a case when the physical quantity correlated with the voltage falls to the predetermined value during the period that the drive motor is in the stop state after the stop of the charge of the energy storage device, to analyze the cause for the fall in the voltage of the energy storage device to the predetermined voltage or the cause for the fall in the physical quantity correlated with the voltage to the predetermined value, based on measured data of the energy storage device, the measured data measured during the period that the drive motor is in the stop state after the stop of the charge of the energy storage device.

15. An engine-driven vehicle comprising the energy storage apparatus according to claim 13.

16. An electric vehicle comprising the energy storage apparatus according to claim 14.

17. A management device for an energy storage device, the management device comprising:
a cause analysis unit configured, in a case when a voltage of the energy storage device falls to a predetermined voltage after a stop of a power supply to the energy storage device, or in a case when a physical quantity correlated with the voltage falls to a predetermined value after the stop of the power supply to the energy storage device, to analyze a cause for a fall in the voltage of the energy storage device to the predetermined voltage or a cause for a fall in the physical quantity correlated with the voltage to the predetermined value, based on measured data of the energy storage device, the measured data measured after the stop of the power supply to the energy storage device,
wherein the cause analysis unit is further configured:
to calculate, based on data of the voltage of the energy storage device, a first discharge capacity that the energy storage device discharges during a period from the stop of the power supply until the fall in the voltage of the energy storage device to the predetermined voltage or during a period from the stop of the power supply until the fall in the physical quantity correlated with the voltage to the predetermined value;

to calculate, based on data of a current from the energy storage device, a second discharge capacity that the energy storage device discharges to a load during the period from the stop of the power supply until the fall in the voltage of the energy storage device to the predetermined voltage or during the period from the stop of the power supply until the fall in the physical quantity correlated with the voltage to the predetermined value; and to determine, based on a difference between the first discharge capacity calculated and the second discharge capacity calculated, whether or not the cause for the fall in the voltage of the energy storage device to the predetermined voltage or the cause for the fall in the physical quantity correlated with the voltage to the predetermine value is an internal short-circuit of the energy storage device.

* * * * *